(12) United States Patent
Laceky et al.

(10) Patent No.: US 8,692,500 B2
(45) Date of Patent: *Apr. 8, 2014

(54) SYSTEMS, APPARATUS AND METHODS FOR MAKING AN ELECTRICAL CONNECTION TO A ROBOT

(75) Inventors: William P. Laceky, Georgetown, TX (US); Izya Kremerman, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/592,005

(22) Filed: Aug. 22, 2012

(65) Prior Publication Data

US 2012/0321434 A1 Dec. 20, 2012

Related U.S. Application Data

(63) Continuation of application No. 12/684,772, filed on Jan. 8, 2010, now Pat. No. 8,264,187.

(60) Provisional application No. 61/143,809, filed on Jan. 11, 2009.

(51) Int. Cl.
*B25J 9/18* (2006.01)

(52) U.S. Cl.
USPC ............ 318/568.11; 318/568.12; 318/568.16

(58) Field of Classification Search
USPC ............ 318/568.11, 568.12, 568.16, 568.21; 901/2, 30, 14, 9
See application file for complete search history.

(56) References Cited

U.S. PATENT DOCUMENTS

| 4,223,313 | A | 9/1980 | Chabrol |
| 7,347,120 | B2 | 3/2008 | Friedrich et al. |
| 2005/0066902 | A1 | 3/2005 | Fink |
| 2006/0245905 | A1 | 11/2006 | Hudgens |
| 2007/0116549 | A1 | 5/2007 | Rice et al. |
| 2007/0166135 | A1* | 7/2007 | Koike .......................... 414/217 |
| 2008/0063504 | A1 | 3/2008 | Kroetz et al. |
| 2008/0298945 | A1 | 12/2008 | Cox et al. |
| 2010/0178135 | A1 | 7/2010 | Laceky et al. |
| 2010/0178139 | A1 | 7/2010 | Sundar et al. |
| 2010/0178146 | A1 | 7/2010 | Kremerman et al. |
| 2010/0178147 | A1 | 7/2010 | Kremerman et al. |

FOREIGN PATENT DOCUMENTS

| CN | 1617789 A | 5/2005 |
| JP | 2-159744 A | 6/1990 |
| JP | A H4-291741 | 10/1992 |
| JP | H0663885 | 3/1994 |

(Continued)

OTHER PUBLICATIONS

International Search Report and Written Opinion of International Application No. PCT/US2010/020510 mailed Aug. 23, 2010.

(Continued)

*Primary Examiner* — Karen Masih
(74) *Attorney, Agent, or Firm* — Dugan & Dugan, PC

(57) ABSTRACT

Systems, apparatus and methods are disclosed for allowing electrical connection to a robot apparatus. In one aspect, an electrical coupling is adapted to provide electrical power to the robot apparatus in the vacuum chamber. The electrical coupling may include engaging electrical contacts. In some embodiments, at least one of the contacts may be suspended relative to a spring such that the engaging contacts do not rotate relative to each other during arm rotation of the robot. In other embodiments, inductively coupled coils are included. Numerous other aspects are provided.

20 Claims, 27 Drawing Sheets

(56) References Cited

FOREIGN PATENT DOCUMENTS

| | | |
|---|---|---|
| JP | 06-025961 | 7/1994 |
| JP | 07-100786 | 4/1995 |
| JP | 08-051137 | 2/1996 |
| JP | 08-083832 | 3/1996 |
| JP | A H8-243968 | 9/1996 |
| JP | 10-255894 | 9/1998 |
| JP | 2000-268912 | 9/2000 |
| JP | 2002-299426 | 10/2002 |
| JP | 2004-165198 | 6/2004 |
| JP | 2005-158827 | 6/2005 |
| JP | 2006-005136 | 1/2006 |
| JP | 2007-073373 | 3/2007 |
| JP | A 2007-73363 | 3/2007 |
| KR | 10-0309240 | 8/2003 |
| TW | 543079 | 7/2003 |
| TW | 200740677 A | 11/2007 |
| WO | WO 93/26020 | 12/1993 |
| WO | WO 2005/049259 | 6/2005 |

OTHER PUBLICATIONS

International Preliminary Report on Patentability of International Application No. PCT/US2010/020510 mailed Jul. 21, 2011.
Office Action of U.S. Appl. No. 12/684,772 mailed Apr. 18, 2012.
Response to Office Action of U.S. Appl. No. 12/684,772, filed Jul. 12, 2012.
Notice of Allowance of U.S. Appl. No. 12/684,772 mailed Jul. 25, 2012.
Supplemental Notice of Allowance of U.S. Appl. No. 12/684,772 mailed Aug. 3, 2012.
Taiwan Search Report of Taiwan Patent Application No. 99100593 dated Mar. 5, 2013.
Chinese Search Report of Chinese Patent Application No. 201080012684.7 dated Jan. 11, 2013.
Japanese Office Action of Japanese Patent Application No. 2011-545461 dated Sep. 24, 2013.

\* cited by examiner

SYSTEMS, APPARATUS AND METHODS FOR MAKING AN ELECTRICAL CONNECTION TO A ROBOT

The present application claims priority to U.S. Non-Provisional patent application Ser. No. 12/684,772, filed Jan. 8, 2010, and entitled "SYSTEMS, APPARATUS AND METHODS FOR MAKING AN ELECTRICAL CONNECTION", which claims priority to U.S. Provisional Patent Application No. 61/143,809, filed Jan. 11, 2009, and entitled "SYSTEMS, APPARATUS AND METHODS FOR MAKING AN ELECTRICAL CONNECTION TO A ROBOT AND ELECTRICAL END EFFECTOR THEREOF", which is hereby incorporated herein by reference in its entirety for all purposes.

RELATED APPLICATIONS/PATENTS

The present application is related to the following commonly-assigned, co-pending U.S. patent applications and patents, which are hereby incorporated herein by reference in its entirety for all purposes:

U.S. Patent Application Ser. No. 61/143,807 co-filed with the present application on Jan. 11, 2009, and entitled "Electrostatic End Effector Apparatus, Systems and Methods for Transporting Substrates".

FIELD

The present invention relates to electronic device manufacturing, and more specifically to systems, apparatus and methods for transporting substrates.

BACKGROUND

Conventional electronic device manufacturing systems may include multiple process chambers and load lock chambers. Such chambers may be included in cluster tools, for example. These systems and tools may employ robots to move substrates (silicon wafers, glass plates, etc.) between the various process chambers and load locks (e.g., process chamber to process chamber, load lock chamber to process chamber, and process chamber to load lock chamber). Efficient and precise transport of substrates between the various system chamber components may be important to system throughput, thereby lowering overall operating costs.

Accordingly, systems, apparatus and methods for efficient and precise movement of the substrates are desired.

SUMMARY

In one aspect a robotic system is provided which includes a vacuum chamber, a robot apparatus adapted to transport substrates within the vacuum chamber, the robot apparatus including an electrical coupling adapted to provide electrical power to the robot apparatus in the vacuum chamber.

In another aspect, a substrate transporting robot apparatus adapted to move substrates within an electronic device processing system is provided, which includes a robot and an electrical coupling comprising selectively engaging electrical contacts, the electrical coupling adapted to provide electrical energy from a power source to the robot.

In another aspect, a substrate transporting robot apparatus is provided, which is adapted to move substrates within an electronic device processing system. The apparatus includes a robot, an electrical coupling comprising selectively engaging electrical contacts, and electrical leads coupled to the robot, wherein electrical energy is supplied to the electrical leads by passing an electrical current through the selectively engaging electrical contacts.

In another aspect, a method of moving a substrate within an electronic device processing tool is provided. The method includes providing a robot within a vacuum chamber, and supplying electrical energy to electrical leads coupled to the robot by passing the electrical energy through selectively engageable contacts or inductively coupleable coils.

Numerous other aspects are provided in accordance with these and other aspects of the invention. Other features and aspects of the present invention will become more fully apparent from the following detailed description, the appended claims and the accompanying drawings.

DETAILED DESCRIPTION

Figure 1:
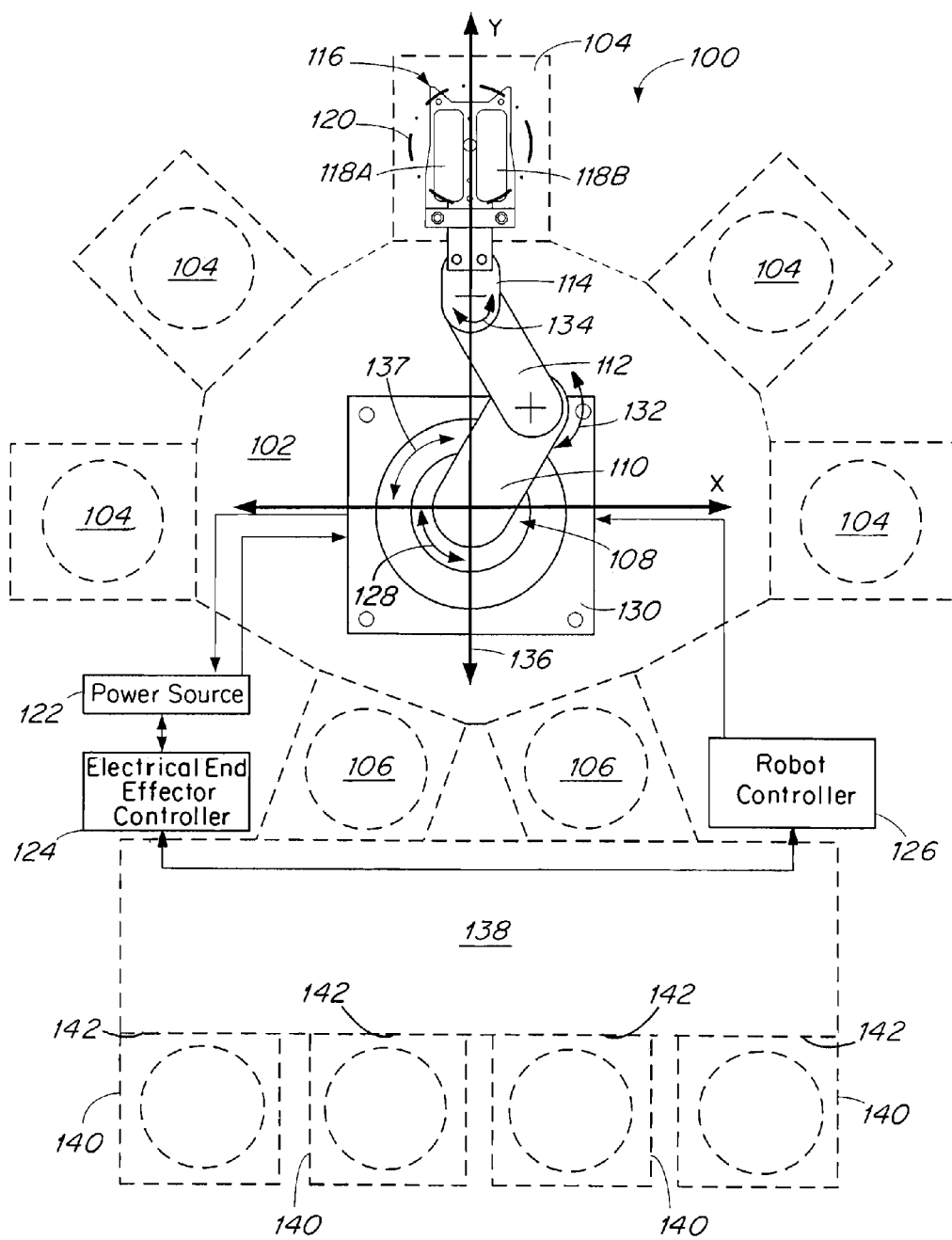
FIG. 1 is a schematic top view of a substrate transport system according to embodiments of the present invention.

To improve the precision and/or speed of transport of substrates within electronic device manufacturing facilities and tools, electrical end effectors, which may hold the substrate and deter the substrate from slippage, may be utilized. For example, the electrical end effector may include electrical power to electrodes (e.g., plates) which when appropriately powered will provide an electrostatic charge generation capability. The electrostatic charge, when provided at the end effector, may attract and pull the substrate to the end effector with an electrostatic attraction force. The electrostatic force on the substrate may be of a sufficient magnitude so that the end effector and attached substrate may be moved at a relatively high rate of speed in a lateral direction (in an X-Y plane—see FIG. 1) without slippage of the substrate on the end effector.

In particular, such electrostatic end effectors may include electrical circuit connections to a power source, and a control system to provide power to produce the electrostatic attraction forces in the end effector and control the relative amount of the electrostatic charge. However, because many areas where such robots operate may be provided within a vacuum (e.g., vacuum transfer chambers of process cluster tools), electrical connections may be desired, which connect to the electrical end effector and which may enable bridging a vacuum chamber wall. Moreover, electrical connections, which may survive the significant repetitive motions of the robot arms, are also desired such that service intervals may be maximized. Moreover, it may be desirable for a robot to rotate greater than 360 degrees in the same rotational direction; in which case any fixed connection wires or other conductors between the electrical end effector and the power source would be twisted and possibly broken. The present invention provides a solution to this problem.

Accordingly, the present invention, in one aspect, is directed at providing an electrical feed through apparatus for bridging the vacuum chamber wall interface to provide electrical power inside the vacuum chamber to the electrical end effector. In another aspect, the present invention is directed to an apparatus for providing an electrical connection through the various relatively moveable robot arms of the robot. In accordance with another aspect, the connections may be oriented and configured such that fatigue and/or wear of the electrical circuit may be minimized. Moreover, the connections may be oriented and configured such that particle generation is minimized. In yet another aspect, the invention is directed at a substrate processing system including a robot apparatus having an electrostatic end effector included within a transfer chamber and further including an electrical coupling adapted to provide power to the electrostatic end effector.

In another aspect, the invention may provide electrical power coupling to an electrical end effector while limiting frictional drag from slip rings or other electrical rotary couplings. In yet another aspect of the invention, electrical coupling may be selectively engageable. This selectively engageable feature may include engaging an electrical connection for providing electrical energy to the electrical end effector prior to starting a robot motion profile, and then utilizing a brief time within the time needed to accomplish the robot motion profile to disengage the electrical connection. For example, the electrical connection may be disconnected momentarily at one or more locations within the motion profile of the robot. The disengagement may allow for the electrical wires connected from the power source to the end effector to release any built up stresses or twisting, which may have resulted from carrying out the robot motion profile. In some embodiments, the selectively engageable feature may allow for powering and/or charging of components, which supply electrical power to the electrostatic end effector, and then disengagement of the contacts so that the arms of the robot may be rotated with minimized frictional resistance. Capacitive embodiments are described where electrical power to the electrical end effector may be provided by a capacitive component or chargeable circuit even after the contacts are disengaged. These methods and apparatus of the invention for engaging and selectively disengaging electrical contacts between the power source and the end effector may be used inside the vacuum environment. Additionally, the present invention may eliminate the need for a conventional rotational feed through mechanism between atmosphere and the vacuum environment.

Additional embodiments are directed to systems including an electrical coupling having inductively coupled coils. In these embodiments, electrical power to the electrical end effector may be provided through inductively-coupled coils. The power may be used to provide power to power storage and a charging circuit or used to power the electrostatic end effector directly.

Further details of exemplary embodiments of the invention are described below with reference to FIGS. 1-17.

One system which may be used for transporting substrates (e.g., wafers, glass plates, etc.) between various chambers in electronic device manufacturing according to the present invention is shown and described with reference to FIG. 1. The robotic transportation system 100 may include a vacuum transfer chamber 102 whose boundaries are shown dotted and one or more process chambers 104 and/or one or more load lock chambers 106 coupled to the transfer chamber 102 (each also shown dotted).

A robot 108, such as a conventional SCARA ("Selective Compliant Assembly Robot Arm"), may be used to transport substrates between respective chambers 104, 106 (e.g., process chamber to process chamber, process chamber to load lock chamber, and vice versa). A SCARA may include an upper arm 110 rotatable about a shoulder axis (shown at the intersection of the X and Y axes), a forearm 112 rotatable about an elbow axis on an outboard end of the upper arm 110, and a wrist member 114 rotatable about a wrist member axis at an outboard end of the forearm 112.

An electrical end effector 116 may be attached to the wrist member 114 by any suitable means such as bolts, screws or other mechanical fasteners. The electrical end effector 116 may be an electrostatic end effector and may include two or more electrodes 118A, 118B which, when provided with a suitable voltage potential applied to the electrodes 118A, 118B, may generate an electrostatic charge, which is adapted to adhere a substrate 120, shown in a phantom line, to the electrostatic end effector 116. Electrostatic end effectors are described in more detail in co-filed U.S. Patent Application Ser. No. 61/143,807, filed on Jan. 11, 2009, and entitled "Electrostatic End Effector Apparatus and Systems and Methods for Transporting Substrates".

The electrical end effector 116 may receive its power from a power source 122, which is controlled by an electrical end effector controller 124. The end effector controller 124 may turn on and off the power to the electrical end effector 116, such as an electrostatic end effector 116 at predetermined times when carrying out the motion profile of the robot 108. The robot controller 126 and end effector controller 124 may communicate the times when power is to be provided to the end effector 116, as well as when power to the end effector 116 is to be cut. Further, the controller 124 may engage a selectable ground such that an electrostatic charge in the electrical end effector 116 may be readily discharged, if desired. Accordingly, release of the electric charge may allow the substrate 120 to be readily put at a position, and not be dragged away when removing (retracting) the electrical end effector 116 from a process chamber 104 or load lock chamber 106. The robot controller 126 may be adapted to control the operation and orientation of the robot 108. The robot controller 126 is entirely conventional and will not be further described herein.

For example, to extend and retract the electrical end effector 116 to and from a process chamber 104, the robot controller 126 may cause the upper arm 110 to rotate about a shoulder axis as shown by arrow 128 within an X-Y plane as defined by the X axis and Y axis shown in FIG. 1. The rotation may be clockwise (for retraction) or counterclockwise (for extension) through an angle of up to about a +/−360 degree excursion. With a conventional SCARA, the forearm 112 may be adapted to rotate in a direction as shown by arrow 132. With conventional gearing, rotation of the forearm 112 may cause the wrist member 114 to rotate relative to the forearm 112 as shown by arrow 134. When a conventional SCARA robot is used as the robot 108, the electrical end effector 116 may translate relative to the base 130 along a translation axis connecting the shoulder axis of the upper arm 110 and the wrist axis of the wrist member 114, wherein the translation axis is designated as 136 which in this embodiment coincides with the Y axis. Accordingly, pure translation of the end effector 116, with no rotation, when accomplishing extension and retraction motions may be provided. Further, the substrate 120 may be moved from one process chamber 104 to another process chamber 104 or process chamber 104 to load lock chamber 106 or from load lock chamber 106 to process chamber 104 by the action of the robot 108 rotating the assembly of arms 110, 112, 114 along arrow 137.

In particular, each of the process chambers 104 and load lock chambers 106 may be serviced by the robot 108 whereby substrates 120 may be picked from and put to the various chambers. In more detail, the electrical end effector 116 is retracted from one chamber (e.g., 104) with a substrate 120 resting on the electrical end effector 116. Once retracted, the entire robot may be rotated about the base 130 along arrow 137. Thereafter, the robot arms 110, 112, 114 may be actuated to deliver the electrical end effector 116 and substrate 120 residing thereon to another chamber (e.g., 104 or 106).

Substrates 120 may be transferred to the load lock chambers 106 by a robot (not shown), which may be resident in a factory interface 138. The transfer of the substrates within the factory interface 138 may be from substrate carriers 140 docked at load ports 142, for example. Possible locations for substrates in the substrate carriers 140 and elsewhere in the load locks 106 and process chambers 104 are shown as dotted circles.

Figure 2A:
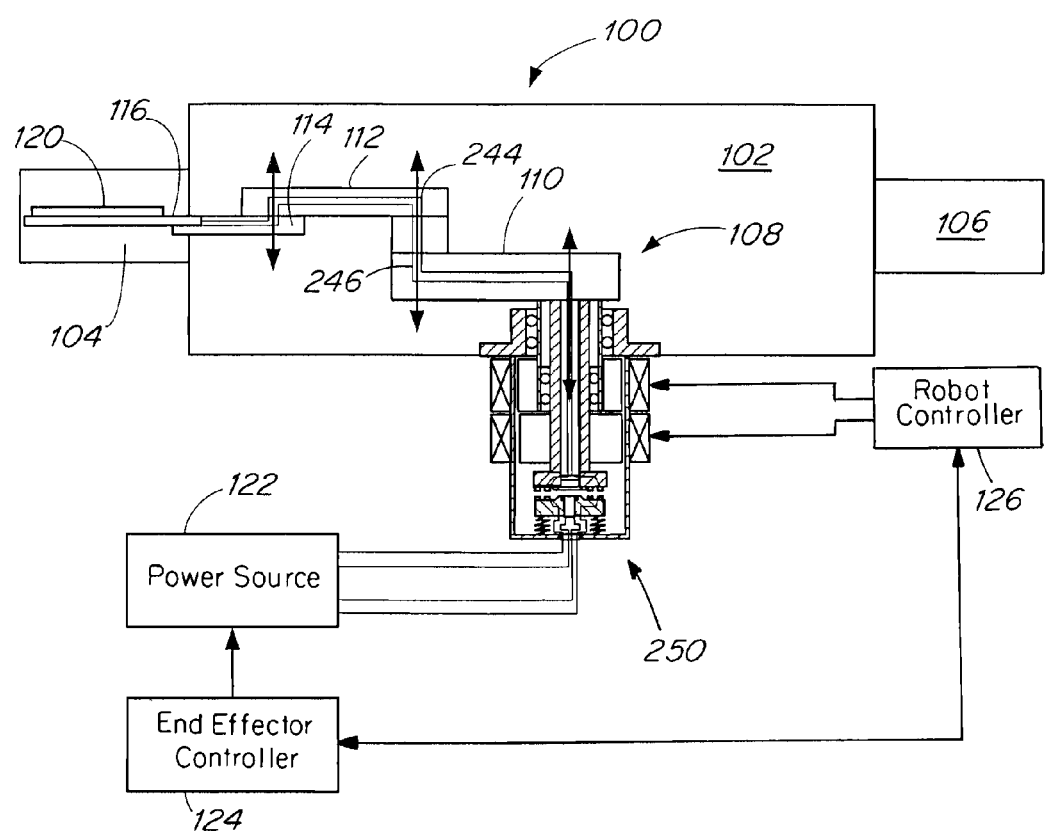
FIG. 2A is a schematic partially cross sectioned side view of a substrate transport system according to embodiments of the present invention.

Referring now to FIG. 2A, a schematic side view diagram of an exemplary embodiment of a substrate transportation system 100 of the present invention is shown. The robot 108, including upper arm 110, forearm 112 and wrist member 114 is shown in a fully-extended orientation servicing a process chamber 104 by inserting an electrical end effector 116 (the same as described within reference to FIG. 1) into the process chamber 104 such that the substrate 120 may be lifted off from the end effector 116 by lift pins or another suitable mechanism (not shown). Optionally, the put (placement of the substrate) within the chamber (104 or 106) may be accomplished by a z-axis functionality of the robot 108 whereby the robot 108 has the capability of lowering and raising the end effector 116 to accomplish a put or pick along the Z axis. The motion of the robot 108 is controlled via a robot controller 126.

In accordance with an aspect of the invention, electrical leads 244 are provided passing through the upper arm 110, the forearm 112, and wrist member 114 to electrically connect with the electrodes 118A, 118B (FIG. 1) of the electrical end effector 116 mounted at the wrist member 114. A ground lead (not shown) may also be provided and pass along the same path as the electrical leads 244, 246. Details of the path of the electrical leads 244, 246 through the upper arm 110, forearm 112, and wrist member 114 are described with reference to FIGS. 2A-12 herein.

Figure 2B:
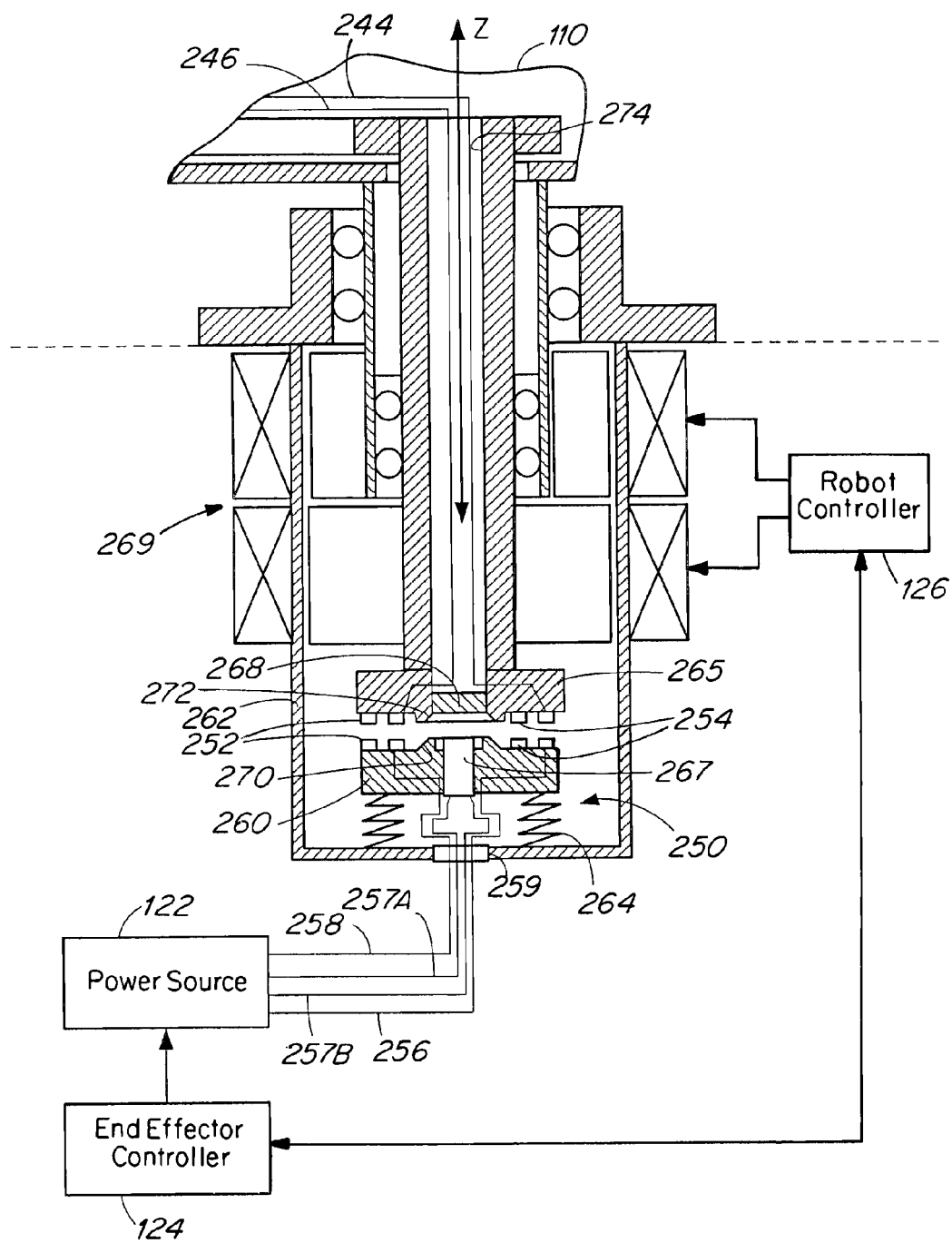
FIG. 2B is an enlarged schematic cross-sectional side view of a portion of a substrate transport system of FIG. 2A according to embodiments of the present invention.

Again referring to FIG. 2A, an electrical coupling 250 is shown, which may be adapted to provide electrical power to the electrical end effector 116 located in the vacuum chamber 102. The coupling allows the bridging, i.e., coupling to the moveable components within the vacuum chamber 102. The electrical coupling 250 is best shown in enlarged partial view in FIG. 2B. In FIG. 2B, the coupling 250 may include engaging contacts such as contact pairs 252, 254, which may be concentric annular rings of conductive material, for example. Other contact configurations may be used. An upper one of the first contact pair 252 may connect to the first electrical lead 244 while a lower one of the first contact pair 252 may be connected to the power source 122 by first power lead 256. Likewise, an upper one of the second contact pair 254 may connect to the second electrical lead 246 while a lower one of the second contact pair 254 may be connected to the power source 122 by second power lead 258. The power leads 256, 258 may pass through a seal 259 which may be hermetically sealed and vacuum tight, as may the other leads 257A, 257B (to be described below). The lower electrical contacts 252, 254 may be attached to a moveable support 260, which may be moveable, and may be suspended relative to a motor housing 262 by a suitable spring member 264. The upper contacts of 252 and 254 may be attached to an end of the shaft 265, such as the enlarged portion of the shaft shown.

The spring member 264 may be of sufficiently low stiffness along a Z axis direction such that when an electromagnet 267 is supplied with suitable current by powering leads 257A, 257B, the electromagnet 267 is drawn to a permanent magnet 268 or, optionally, a ferromagnetic portion of the shaft 265, which causes the support 260 and the attached lower contacts 252, 254 to be moved upwardly in a Z direction so that the lower contacts of the contact pairs 252, 254 operatively engage and contact the upper contacts. The leads 256, 257A, 257B and 258 may all include strain relief loops to accommodate the axial displacement without overstraining the leads.

In this condition of engaged electrical contacts, suitable power may be provided to the electrodes 118A, 118B of the electrical end effector 116 by powering the power leads 256, 258 with the power source 122 to produce an electrostatic charge to attract a substrate 120 to the electrical end effector 116. In addition to being of low stiffness in the z direction, the spring member 264 may be of low stiffness in a torsional direction about the Z axis. In this way, as the contact pairs 252, 254 are engaged, the robot 108 may be rotated by the action of the motive device 269 (having a rotor and stator, for example) to another location, such as to another process chamber 104. This effectively winds up the soft spring member 264 in torsion, by as much as 360 degrees or more. Accordingly, no movement is experienced between the contact pairs 252, 254 in torsion; they effectively rotate together as the spring member 264 is wound up in torsion. The strain relief loops of leads 256, 257A, 257B and 258 may also be sufficient to accommodate a predefined amount of rotational displacement without overstraining the leads.

In FIG. 2B, as soon as the power is removed from the electrical end effector 116 by removing the power to the electromagnet 267 and to the power leads 258, 256, preferably substantially at the same time, the spring member 264 will unload both in torsion and axially along the Z axis, so that the spring member 264 may return to a relaxed or undeflected condition. When the power is applied again to the electromagnet 267, the spring member 264 will initially be in the undeflected, relaxed and neutral condition. Upon powering, again the contacts 252, 254 will come into contact, and the spring 264 will be wound up torsionally upon the next transport movement of the robot 108. Likewise, individual rotations of the shaft 265 to accomplish movements of the forearm 112 and the wrist member 114 may be accommodated without any relative movement between the contact pairs 252, 254 when engaged. In this way, particle generation is minimized as sliding contact of the contact pairs 252, 254 is minimized during rotational movement of shaft 265. In order to maximize axial alignment of the contact pairs 252, 254 upon application of power to the electromagnet 267, a pilot 270 and recess 272 may be provided on the end of shaft 265 and the moveable support 260.

One or more additional contact pairs may be utilized alongside the first and second contact pairs 252, 254 to provide other electrical connections to the robot 108. For example, an additional contact pair (not shown) may be provided for a ground, which may be selectively switchable by the end effector controller 124. Moreover, additional contact pairs may be provided if additional SCARA robots are added, such as in dual SCARA robots with dual end effectors. As will become apparent, the electrical leads 244, 246, in accordance with another aspect, may be part of an electrical circuit and may pass through the rotational axes of the plurality of arms of the robot 108, such as through a hole 274 passing through the shaft 265 of the shoulder axis Z, and then connect to the electrical end effector 116.

In an alternative embodiment, the return of the lower electrical contacts of contact pairs 252, 254 may be accomplished without the use of a spring member 264 coupled to the moveable member 260. For instance, when the contacts 252, 254 are disengaged, a plunger or other actuating means may be actuated to rotate the disengaged lower contacts to a neutral or "zero" position.

Figure 2C:
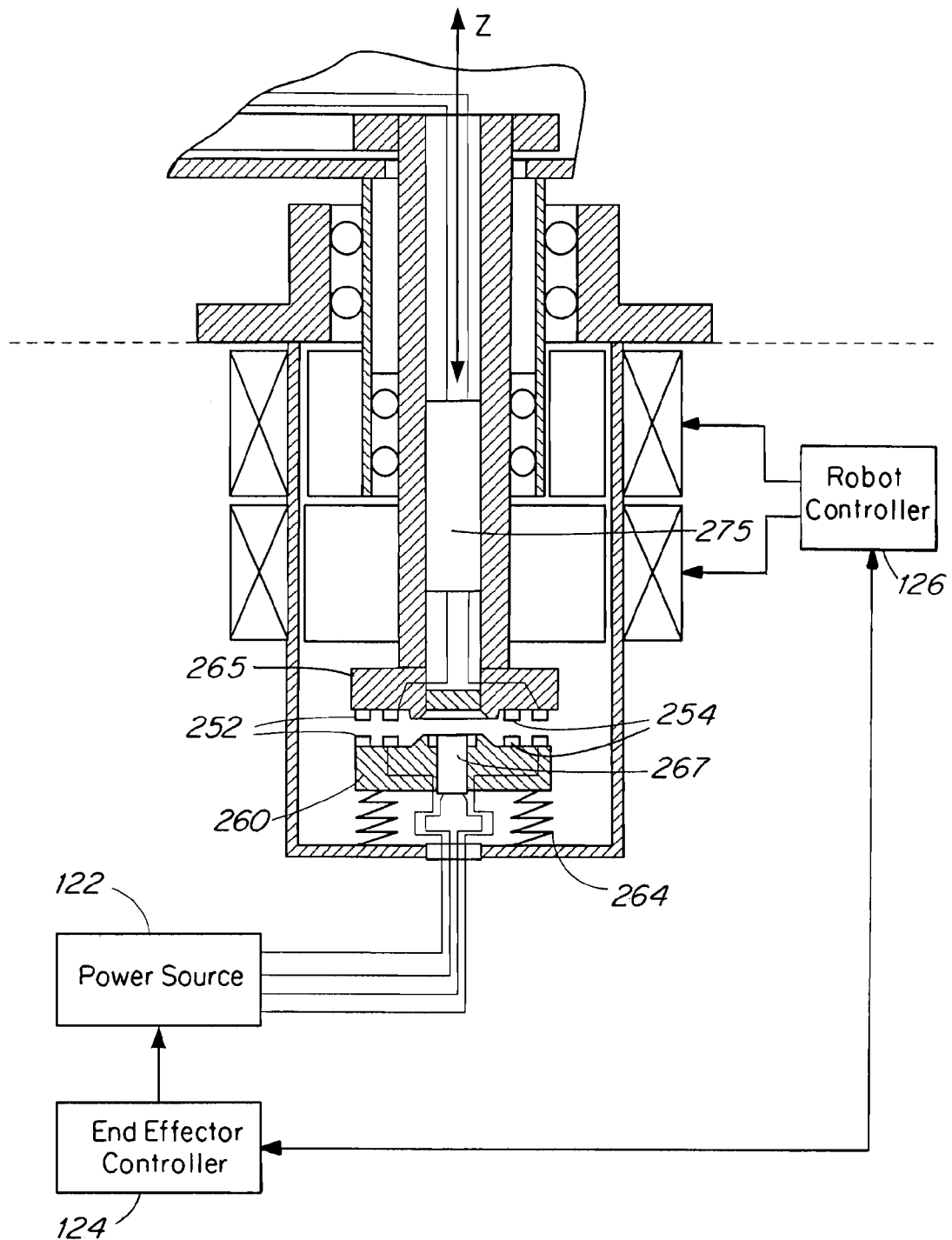
FIG. 2C is a schematic cross-sectional side view of a portion of a substrate transport system according to additional embodiments of the present invention.

Another apparatus for providing electrical energy from the power source 122 to the electrical end effector 116 is shown in FIG. 2C. In this embodiment, momentary engagement of the contacts 252, 254 would electrically charge an appropriate capacitor member 275 with enough energy to hold the substrate 120 in place during a given robot motion profile. The contacts 252, 254 would then be disengaged by removing power from the electromagnet 267, and cutting power from the power source 122, which causes the moving member 260 to relax axially to a neutral position thereby separating the electrical end effector 116 from the power source 122. The stored energy in the capacitor member 275 then supplies the energy needed by the electrical end effector 116 to generate the electrostatic attractive force on the substrate 120. At other times during the motion profile carried out by the robot 108 under the control of the robot controller 126, the contacts 252, 254 may be reengaged momentarily as dictated by the end effector controller 124 such as for a time sufficient to charge the capacitor member 275 and then the contacts 252, 254 may be disengaged. This engagement and disengagement may be done when the robot 108 comes to a stop, for example. In this way, the robot 108 does not need to overcome the torsional spring force resulting from windup of spring 264 to accomplish motion of the shaft 265, as in previously-described embodiments. In other words, as the moveable support 260 is disengaged, rotation of the shaft 265 via suitable control signals to the robot motors from the robot controller 126 may be accomplished with minimized resistance. The robot controller and the end effector controller 124 may communicate to determine when the charging of the capacitor member 275 may take place. The capacitor member 275 may include one or more capacitors of sufficient size to provide an electrostatic force to hold the substrate 120 to the electrical end effector 116. Alternatively, recharging may be accomplished during a moving portion of the motion profile by engaging the contacts 252, 254 and torsionally engaging the spring member 264. These methods may provide for transferring stored energy to the electrical end effector 116 while minimizing any rotational frictional drag and reliability of the mechanism may be improved. Additionally, one or more contacts may be added to provide a ground path through the contacts such that the static electric charge built up on the end effector 116 may be drained (bled) at suitable times during the robot motion profile. For example, before a put operation, the static electric charge may be released through switching a selectively switchable ground. In this manner, the end effector controller 124 may cut power from the power source 122, but continue to supply power to the electromagnet 267 for a time sufficient to release the static charge through a selectively switchable ground.

Figure 2D:
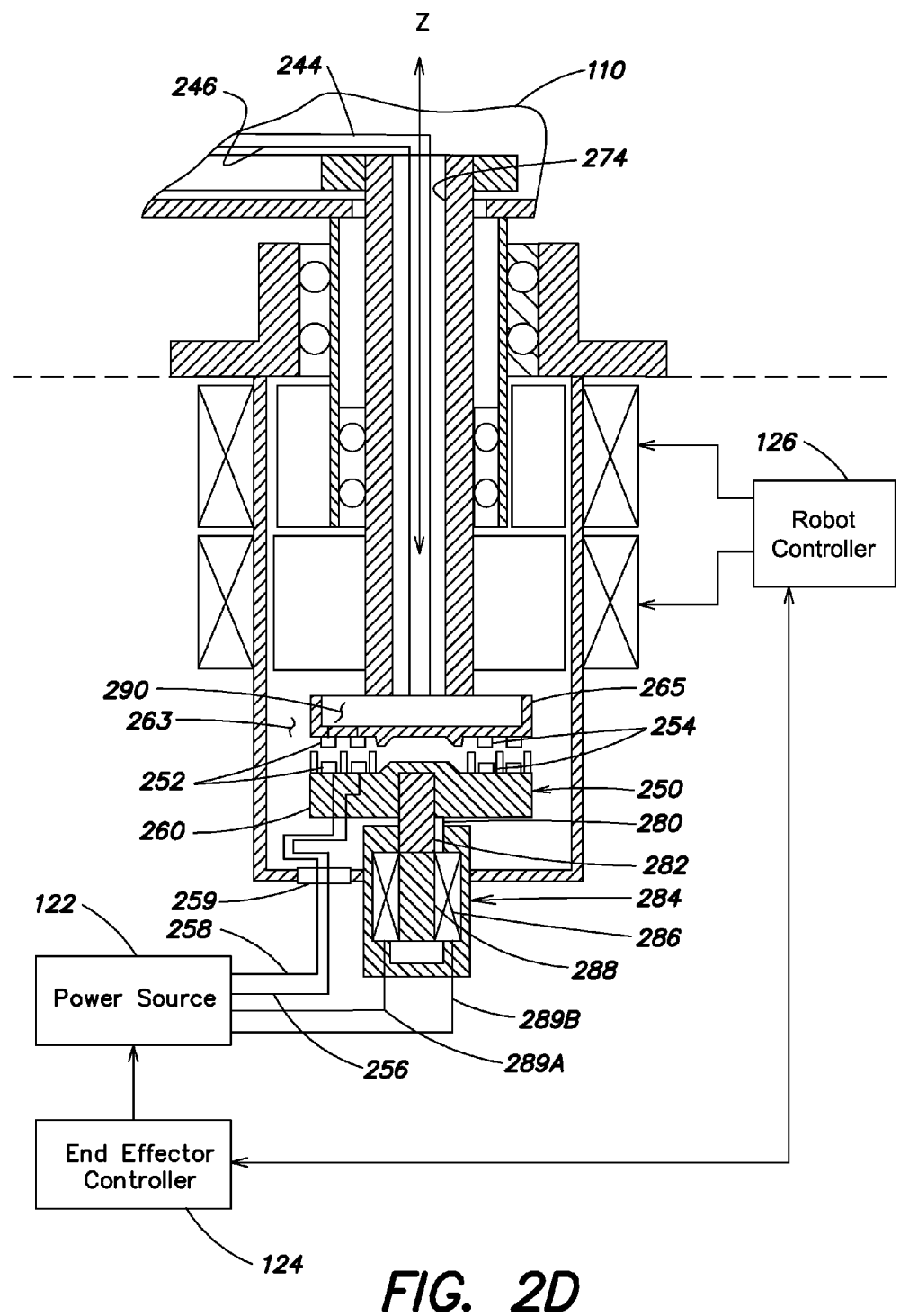
FIG. 2D is a schematic cross-sectional side view of a portion of a substrate transport system according to additional embodiments of the present invention.

In further embodiments, as best shown in FIG. 2D, an actuator may function to actuate the moveable support 260. In this embodiment, the moveable support 260 of the electrical coupling 250 may be restrained against rotational motion by a key or spline 280 located on a shaft 282 connected to the moveable support 260. Other suitable means for restricting rotation may be provided. A solenoid 284 including windings 286 and magnet 288 may be provided, which may selectively actuate the moveable support 260 by providing suitable power to the windings 286 from the power source 122, as dictated by the end effector controller 124. In this manner, the contacts 252, 254 may be engaged into physical contact upon actuation of the solenoid 284. Likewise, the contacts 252, 254 may be physically disengaged by the solenoid 284 returning to a neutral position (as shown) upon cutting the power to the solenoid 284 and a chargeable component. Similar to the previously-described embodiment, the chargeable component (e.g., one or more capacitors or a chargeable circuit) may be charged to provide power to the electrical end effector 116. In the present embodiment, a power storage and distribution circuit 290 is provided, and is electrically connected to the end effector 116 and the upper contacts of contacts 293H.

Figure 2E:
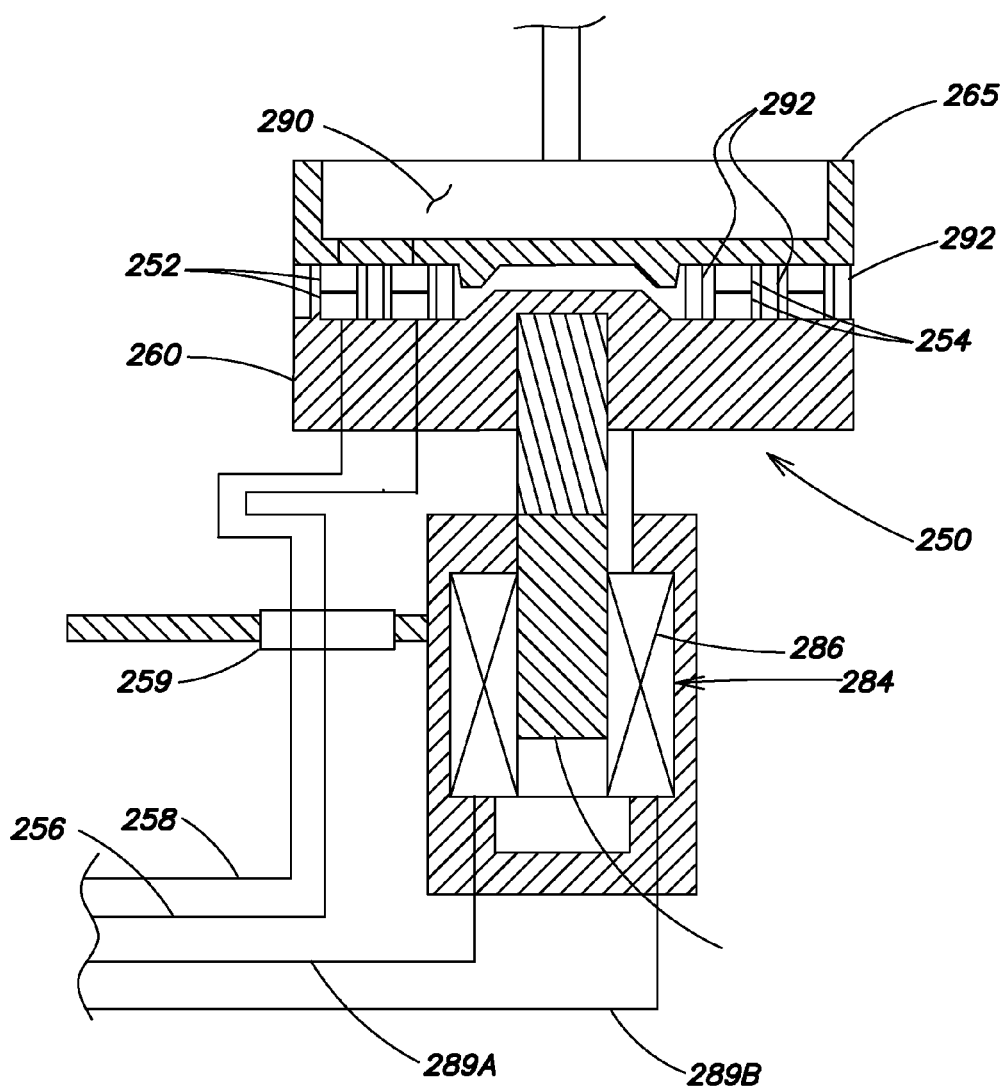
FIG. 2E is an enlarged schematic cross-sectional side view of a portion of a substrate transport system of FIG. 2D shown with the contact engaged.

As shown in FIG. 2E, the moveable support 260 is actuated by the solenoid 284 so that electrical contacts 252, 254 come into electrical contact. Upon contact, one or more capacitors in the power storage and charging circuit 290 (FIG. 2F) may be charged. The actuation may occurs as the robot 108 is stopped momentarily, and such charging of the charging circuit 290 may take about a second or less, or even about 500 ms or less. Flexible seals 292 secured to the moveable support 260 or shaft 265, which may also be formed as annular elastomer rings, may seal the air space about each contact 252, 254 when engaged. This sealing function may minimize glow discharge, arc, corona and/or other electrical breakdowns as the charging takes place. In some embodiments, the solenoid 284 may be actuated slightly before providing the high voltage to charge the power storage and charging circuit 290 to ensure a good seal takes place before charging.

Once the charging is completed, power from the power source 122 may no longer be provided to the solenoid 284 or to the power storage and charging circuit 290, and the moveable support 260 may return to its neutral position, as shown in FIG. 2D. As in the previous embodiments, the electrical leads 256, 258 may be provided with strain relief loops to accommodate the axial motion of the moveable member 260 along the Z axis. Likewise, the leads 258, 259 may pass through a hermetic seal 259 mounted in the motor housing 262, which may contain a motor chamber 263 provided under vacuum. In this manner the electrical coupling 250 of the present invention is adapted to provide electrical energy to the electrical end effector 116 which is positioned in the vacuum chamber 102 connected to the motor chamber 263. The motor chamber 263 and the vacuum chamber 102 may both be provided under a vacuum. Leads 289A, 289B may be provided to the coil 286 if solenoid and may be powered by the power source 122 as commanded by the end effector controller 124.

In the present invention, the electrical coupling 250 provides a means for bridging the vacuum chamber wall and providing power to the end effector 116 without any sliding electrical contacts (e.g., slip rings), which may cause particle generation and parasitic frictional resistance. It should be recognized that although a solenoid 284 is provided to actuate the moveable support 260, that any suitable magnetic or mechanical device may be utilized to move the moveable member 260 so as to cause physical contact between the upper and lower electrical contacts 252, 254. As will be described below, various means for monitoring and determining whether the power storage and charging circuit 290 is appropriately charged may be provided.

Figure 2F:
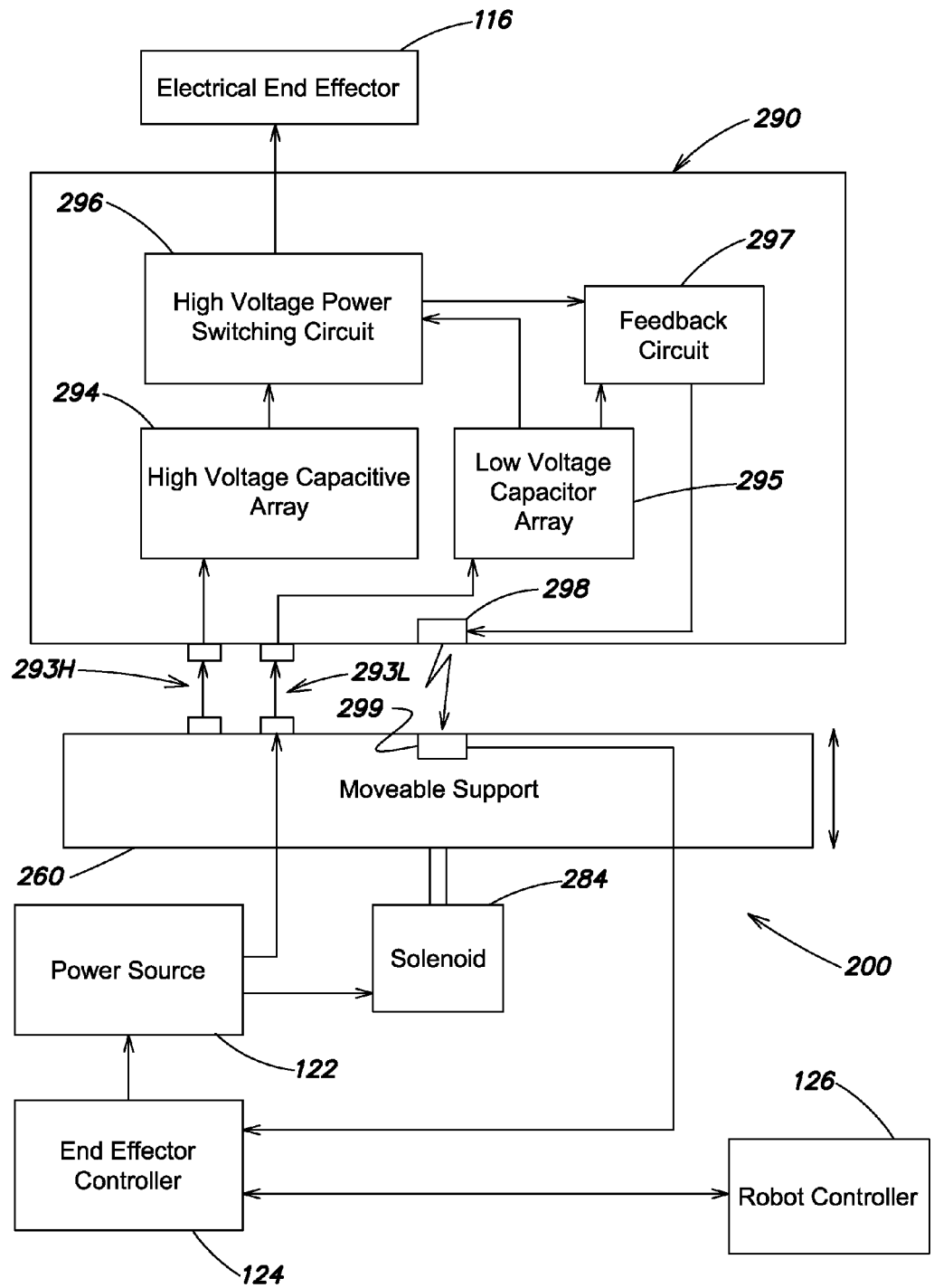
FIG. 2F is a schematic diagram of a substrate transport system according to additional embodiments of the present invention.

Referring now to FIG. 2F, power storage and charging circuit 290 and the relationship to the other components of the robotic transportation system 200 will be described in more detail. As described above, the moveable support 260 may be actuated by a solenoid or like translation-causing mechanism 284 under the control of end effector controller 124. The end effector controller 124, at predetermined times during the robot motion profile, causes the actuation of the solenoid 284 to cause the electrical contacts to contact and electrically engage. In this embodiment, the contacts, each representing two or more electrical paths, are provided as high voltage contacts 293H and low voltage contacts 293L. The high voltage contacts 293H and low voltage contacts 293L may be electrically connected to respective high and low voltage sources provided within the power source 122. When the power sources are connected through contacts 293H, 293L, respective high voltage capacitive array 294 and low voltage capacitive array 295 may be electrically charged. After charging, the moveable support 260 may be moved back to its neutral (non-contacting position) under the control of end effector controller 124 via power from the power source 122 being cut to the solenoid 284.

The high voltage capacitive array 294 and the low voltage capacitor array 295 may provide power to the other components of the power storage and charging circuit 290 and to the electrical end effector 116. In particular, the high voltage capacitive array 294 is connected to a high voltage power switching circuit 296 that connects and disconnects power to the electrical end effector 116. The high voltage power switching circuit 296 may contain suitable electronics and components to connect or disconnect the stored high voltage to the electrical end effector 116 and may also contain components to accomplish the regulation of the electrical current supplied to the electrical end effector 116. However, it is possible to implement the invention without regulation components.

The low voltage capacitor array 295, when charged, provides power to a feedback circuit 297, and may provide power to the high voltage power switching circuit 296. The feedback circuit 297 may function to monitor the current and/or voltage potential supplied to the electrical end effector 116. If the supplied current and/or voltage potential is above a predefined amplitude, as determined by a discrimination circuit, then a light emitting diode (LED) 298 may be continuously illuminated. This indicates that proper chucking ability is present at the electrical end effector 116. A receiver 299 electrically connected to the end effector controller 124 may provide a signal to the controller 124 when light from the LED 298 is being received thereat. Accordingly, if the receiver 299 fails to receive a light signal, the end effector controller 124 may communicate with the robot controller 126 to cause the robot 108 to stop the robot 108 momentarily for a recharge, or slow down the motion of the robot 108 until the next opportunity for a recharge presents itself within the motion profile of the robot. The predefined value is set at a level, which would reduce the attractive force to the point where acceleration of the end effector 116 may cause the substrate 120 to not be properly positioned on, or to fall off from, the end effector 116 during transportation.

At times within the motion profile, the end effector controller 124 may cause the engagement of the solenoid 284 and cause the power source 122 to recharge the high voltage capacitive array 294 and the low voltage capacitor array 295. It should be recognized that feedback mechanisms other than the LED/receiver system described may provide feedback concerning the status of the current and/or voltage supplied to the electrical end effector 116. For example, the feedback may be provided by any suitable feedback mechanism, such as voltage to frequency converter circuitry, radio frequency communication or other wireless communication. In embodiments, the controllers 124 and 126 may be separate controllers or integrated into one common controller.

Figure 2G:
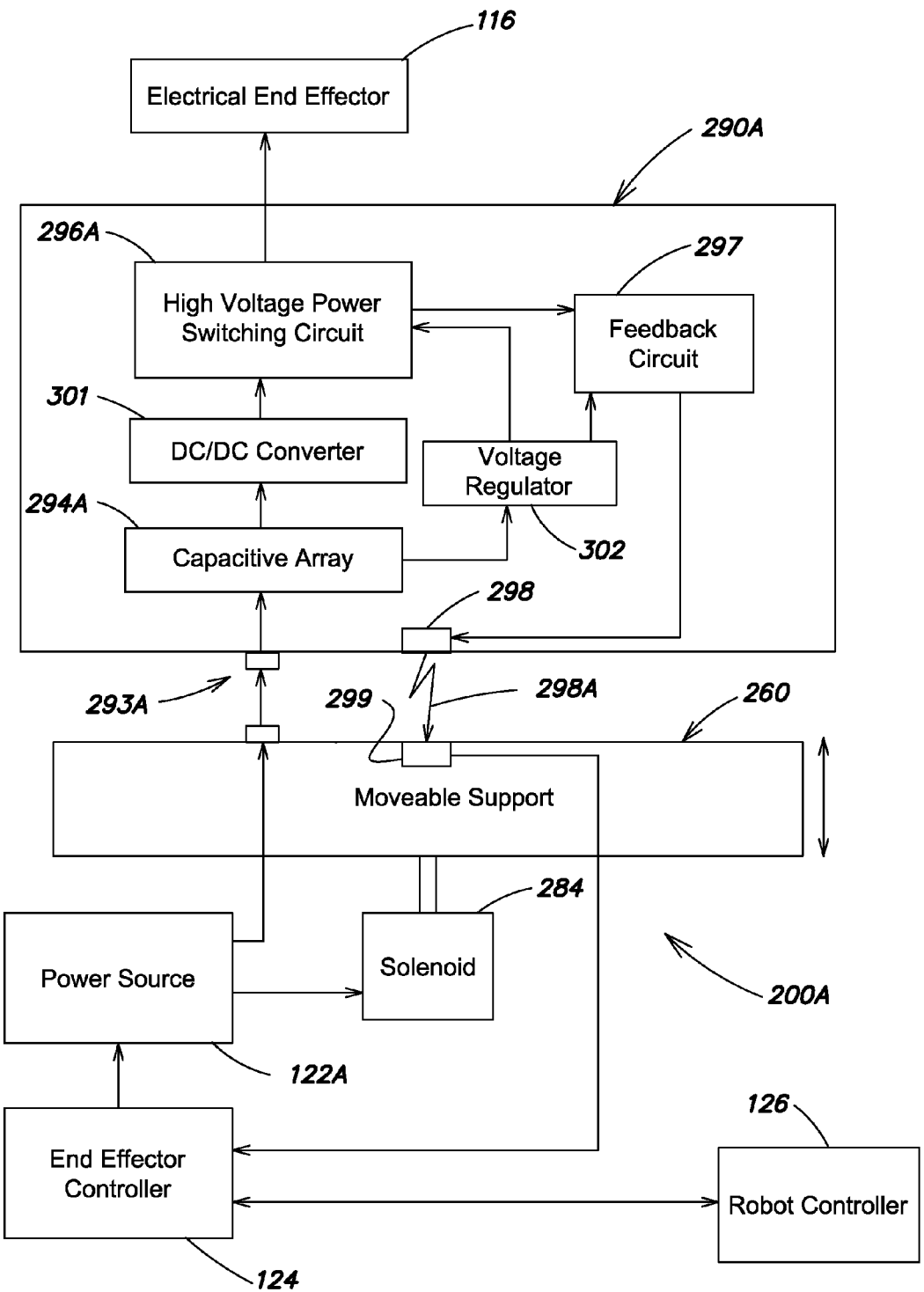
FIG. 2G is a schematic diagram of a substrate transport system according to additional embodiments of the present invention.

FIG. 2G illustrates another embodiment of a transportation system 200A in accordance with aspects of the invention. In this embodiment, the components are the same as in the previous embodiments, except that the power source 122A may be a 24 volt DC power supply, and the power storage and charging circuit 290A may be adapted to convert the 24 volt supply into a high voltage output to the electrical end effector 116. As in the previous embodiments, a moveable support 260 contains electrical contacts 293A, which may be engageable for passing current from the 24 volt power source 122A to a capacitive component 294A (e.g., a capacitor or capacitive array). It should be noted that various other supply voltages could be used other than 24V to power a suitable DC/DC converter for electrostatic applications.

Once charged, a DC/DC converter 301 may function to convert the 24 volt supply to a high voltage supply (e.g., of about 500 V to 2,000 V) and supply high voltage to the high voltage power switching circuit 296A. Power to the switching circuit 296A may be provided by regulating the voltage from the capacitive array 294A via a voltage regulator 302. Optionally, a low voltage power source may be provided through separate low voltage contacts to a low voltage capacitive array, similar to that shown in the FIG. 2F embodiment.

As in the previous embodiment, power condition feedback may be provided. As before, the feedback circuit 297 may illuminate a light source 298 (e.g., an LED) and the light signal 298A may be received by a light receiver 299 (e.g., a photo sensor) mounted on the moveable member 260 or otherwise mounted in the motor housing 262. The receiver 299 may be electrically coupled to the end effector controller 124 or the robot controller 126, or both, such that remedial measures (discussed above) may be taken upon determination of a low power condition, as indicated by no longer receiving the light signal 298A.

Figure 2H:
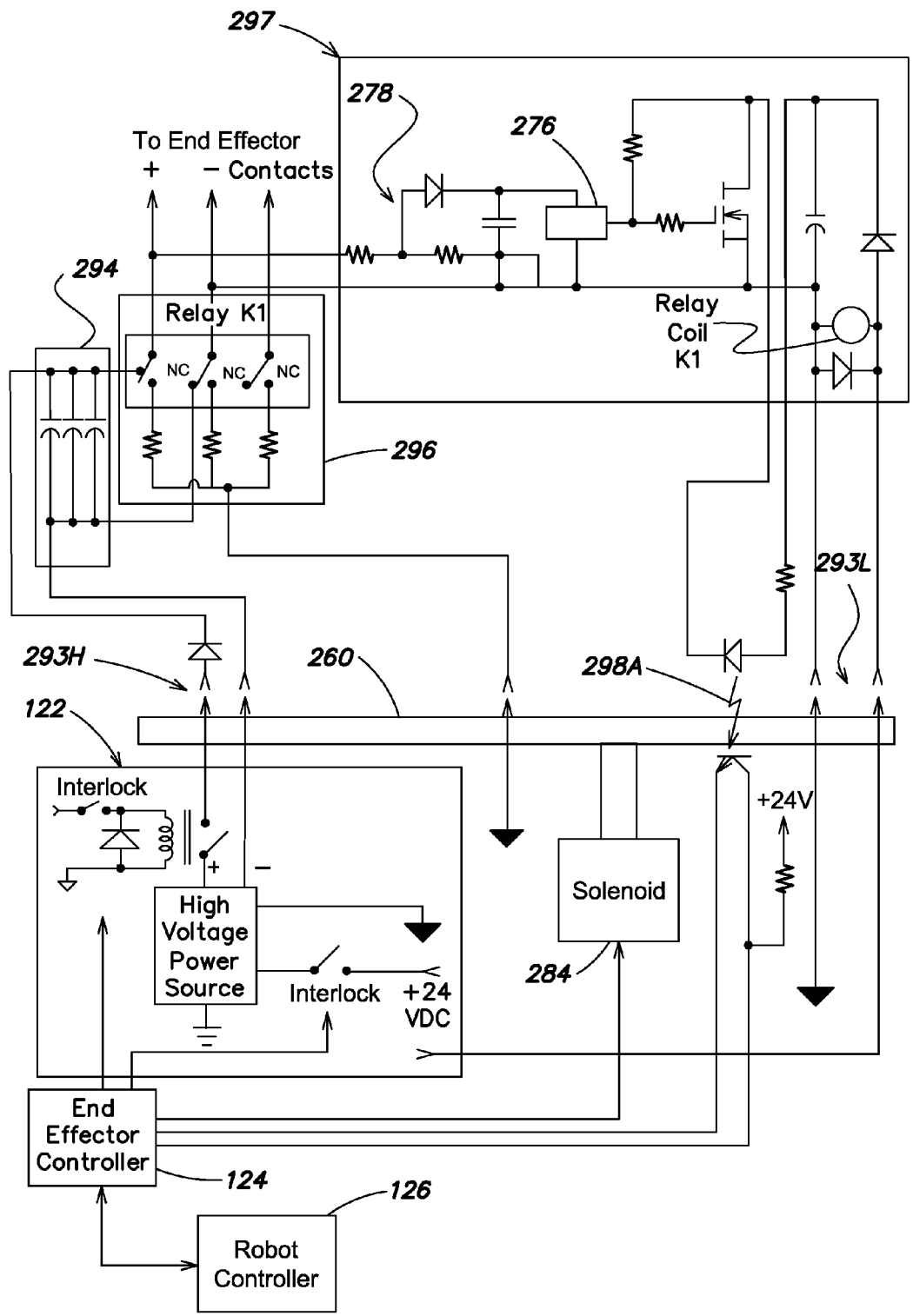
FIG. 2H is a circuit diagram of a substrate transport system according to additional embodiments of the present invention.

FIG. 2H illustrates an electrical circuit diagram, which may be used to accomplish the functions described above. As shown, a power source 122 is provided, which couples a high voltage source to the respective contacts 293H, which are selectively engageable via movement of the moveable member 260 by actuation of the solenoid 284. The supplied current may then be stored as electrical energy in capacitive component 294. Capacitive component 294 may be a suitably-sized capacitor or array of capacitors, for example. Switching circuit 296 controls the power (voltage potential) provided to the positive (+) and negative (−) electrodes of the end effector 116 by either connecting the capacitive component 294 to the end effector electrodes or by disconnecting the capacitive component 294 from the electrodes. K1 relay in its relaxed state (un-energized) holds the relay contacts in the position that connects the capacitive component 294 to the electrodes of the end effector 116. This is the chucking state, which occurs by default when the moveable member 260 is disengaged from the contacts 293H and 293L. Being disengaged, there is no power to energize the K1 relay coil, causing the K1 contacts to relax into the normally closed state, making contact between the capacitive component 294 and the electrodes of the end effector 116. When the moveable member 260 is actuated and makes contact with the contacts 293H and 293L, K1 relay coil is energized, which forces the K1 relay contacts to disconnect the capacitive component 294 from the end effector electrodes. The K1 relay contacts then cause the end effector electrodes to be shorted together or at least be connected to each other through resistance such that any voltage potential between the electrodes are rapidly neutralized. This rapidly releases any chucking force on the substrate, allowing the substrate to be removed from the end effector 116 such as in a "put" motion profile. This is the de-chuck state. Also, while in this state, the capacitive component 294 may be isolated from the end effector electrodes but connected to the power source 122 through contacts 293H, thus allowing the capacitive component 294 to be charged. After adequate charge is completed, the moveable member 260 can disengage again, causing the chucking state to occur again as previously described.

A feedback circuit 297 may provide feedback information concerning the voltage level supplied to electrodes of the electrical end effector 116. An optical diode coupled to the feedback circuit 297 may be normally powered. A voltage supervisor 276 (e.g., STM 1061) may sink the output voltage when the high voltage to the end effector 116, as monitored by the circuit 297, falls below a predetermined threshold set by a voltage divider 278. The sinking output signal provided may disable the optical diode, for example. Thus, the light signal 298A may be shut off via cutting a current via a Mosfet. The lack of signal 298A may then be communicated via a signal from a wireless photo sensor receiver to the end effector controller 124, by providing a +V signal thereto. Accordingly, as a result of the low voltage feedback, additional charging may be provided as needed, or other remedial measures may be communicated to the robot controller 126 causing the robot to stop or slow down to prevent the substrate from falling from the end effector 116.

FIGS. 3A-3C and FIGS. 5-12 illustrate another embodiment of a robot apparatus 300, which may include an upper arm 310 and a forearm 312 with the wrist member (not shown for clarity). Although this embodiment is a dual-arm robot (both arms shown in FIG. 4), the path of the electrical leads 244, 246 will apply equally to both single and dual-arm robots.

Figure 4:
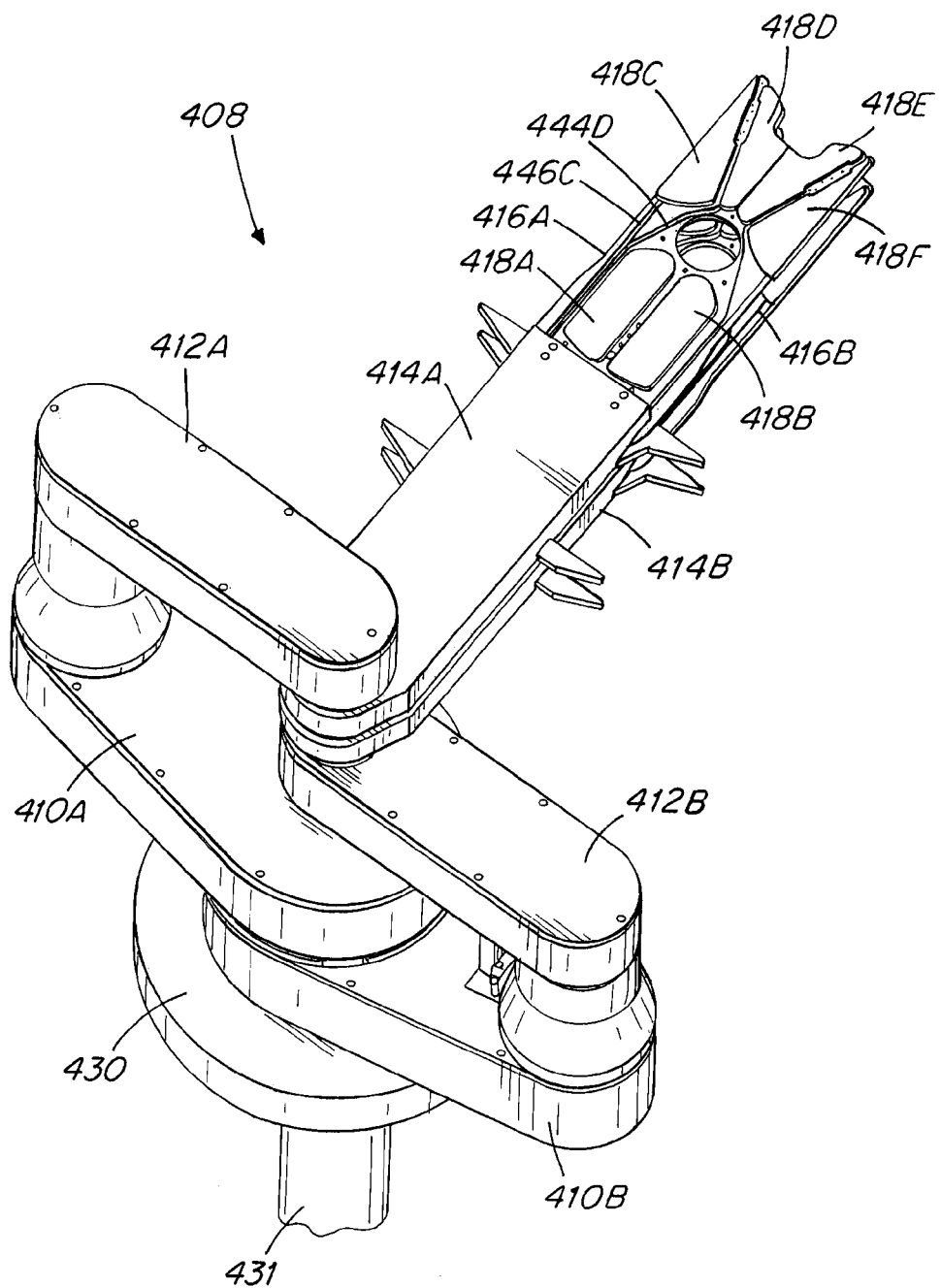
FIG. 4 is a perspective view of a dual robot apparatus according to embodiments of the present invention.

As shown in FIG. 4, the dual-arm robot apparatus 408 in accordance with aspects of the invention may include a base 430 for mounting the robot in a chamber (e.g., a vacuum chamber), an outer shaft 431, first and second upper arms 410A, 410B at least one of which is coupled to the shaft 431, first and second forearms 412A, 412B coupled for rotation relative to the first and second upper arms 410A, 410B, and first and second wrist members 414A, 414B coupled for rotation relative to the forearms 412A, 412B. Electrical end effectors 416A, 416B are shown attached to the wrist members 414A, 414B. The electrical end effectors 416A, 416B may be configured as electrostatic end effectors and may include at least one electrode pair 418A, 418B, and may include several electrode pairs, such as pairs 418C, 418D and pairs 418E, 418F, for example. Any number of electrode pairs may be utilized. The pairs 418A, 418B, etc., when suitably charged, are adapted to attract substrates (not shown) to the electrical end effectors 416A, 416B during transport. Electrical leads, to be described more thoroughly below, pass through the shaft 431 and respective arms and wrist members and electrically connect to the electrodes of the electrical end effectors 416A, 416B via electrical leads 444D, 446C, for example. Other electrical leads may attach to the other electrodes in a like fashion. A suitable ground lead may also attach to the electrodes and pass through the same path as the electrical leads powering the electrodes. This ground lead may be coupled to switchable grounding circuitry to allow a ground to be selectively engaged to drain any electrostatic charge built up on the end effectors 418A, 418B at suitable points during the motion profile.

Figure 3A:
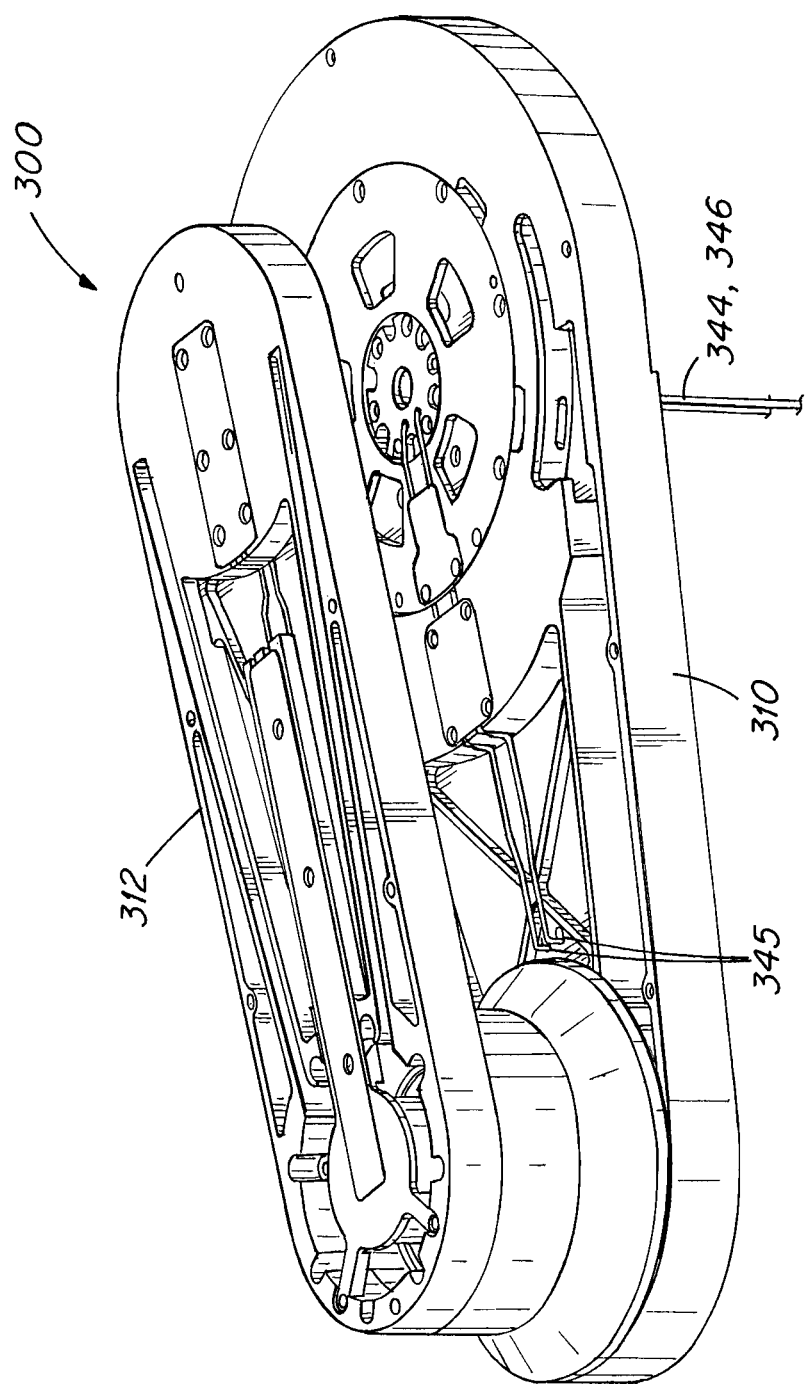
FIG. 3A is a top perspective view of a robot apparatus according to embodiments of the present invention.
Figure 3B:
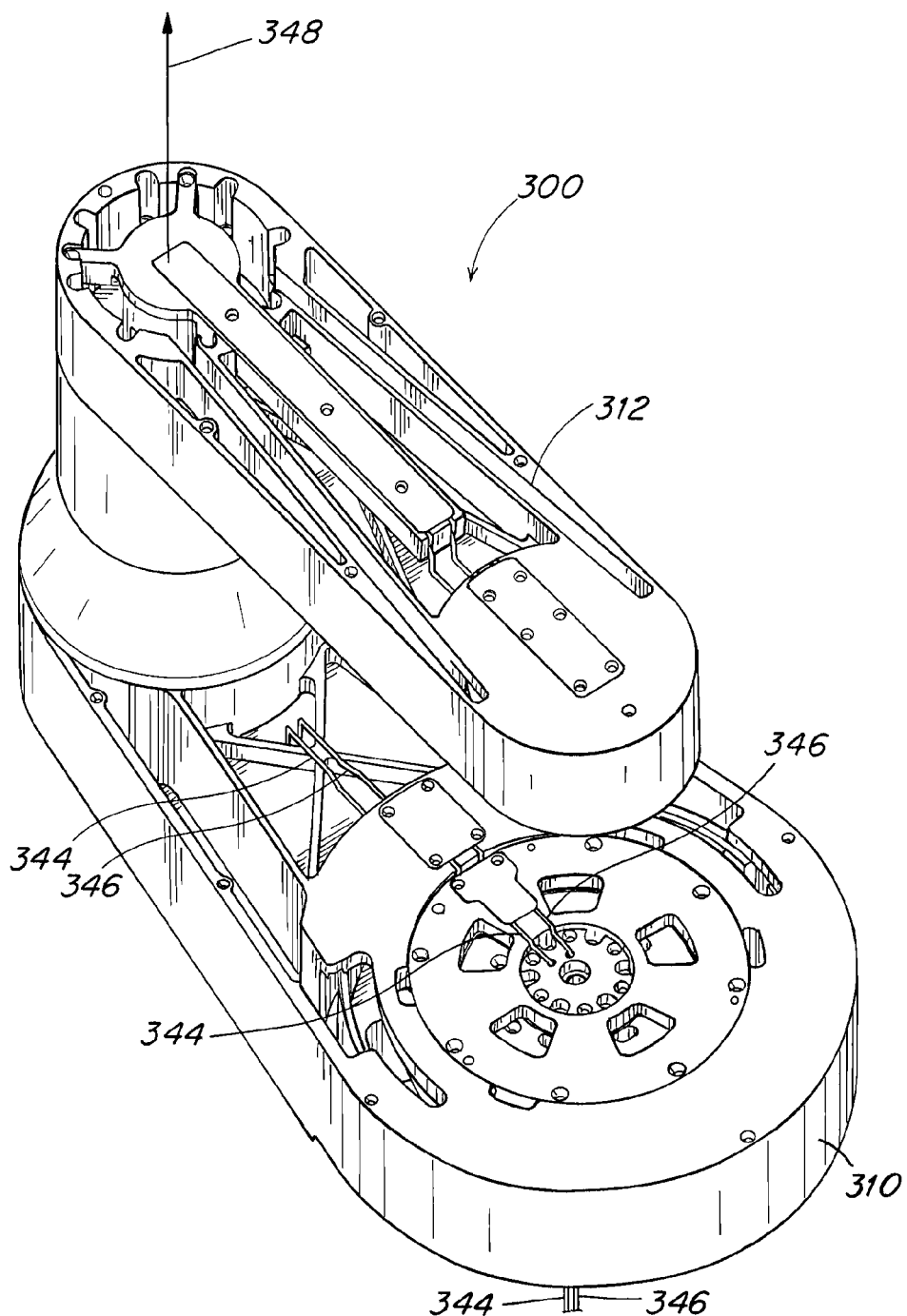
FIG. 3B is an end perspective view of the robot of FIG. 3A according to embodiments of the present invention.
Figure 3C:
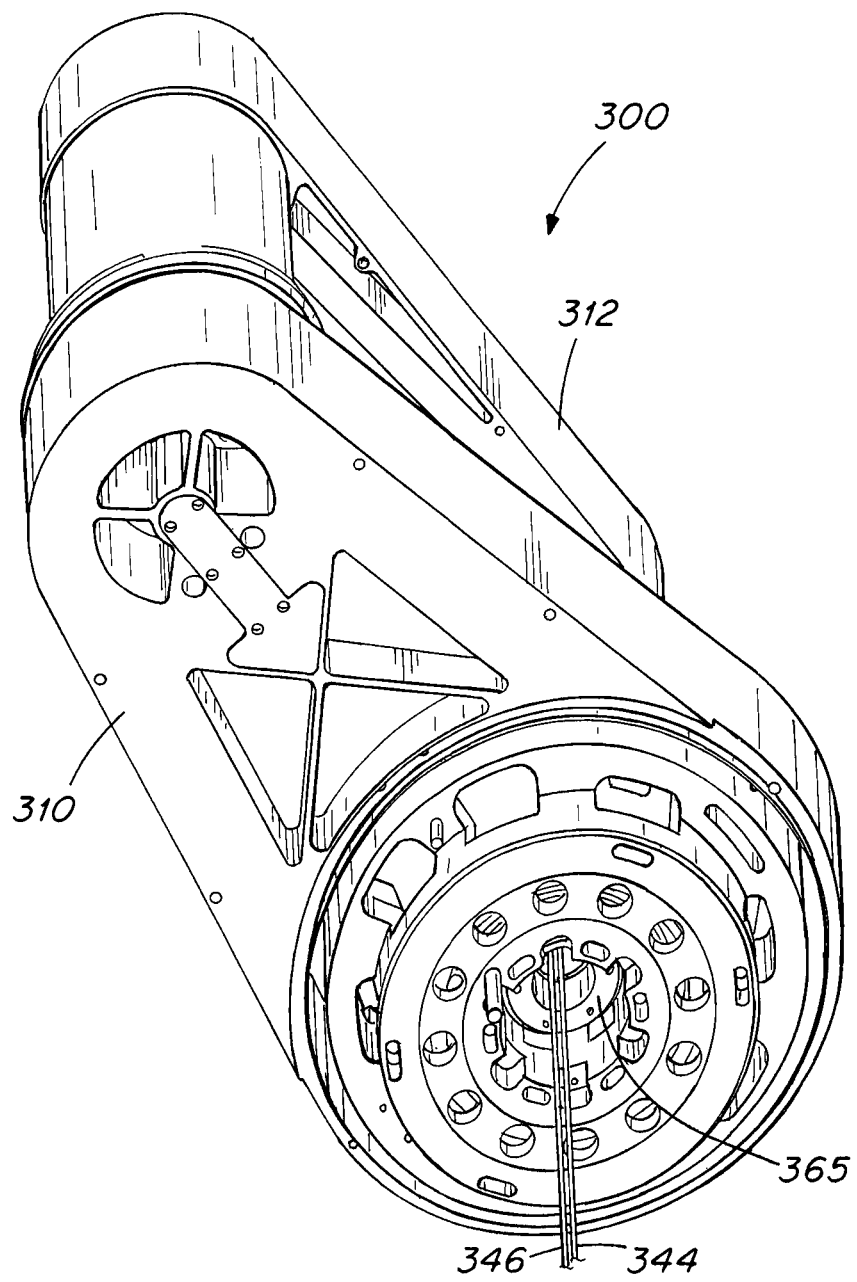
FIG. 3C is a bottom perspective view of the robot of FIG. 3A according to embodiments of the present invention.

In more detail and again referring to FIGS. 3A-3C, the electrical leads 344, 346 of the robot apparatus 300 are adapted to connect to a power supply, through an electrical coupling (see e.g., FIGS. 2A-2G and FIG. 14) which passes the electrical power into robot arms and the vacuum chamber, and ultimately to the electrical end effector (not shown). The electrical leads 344, 346 making up part of the electrical circuit may first pass through one of the shafts 365 (as best shown in FIG. 3C) to an upper surface of the upper arm 310 (as best shown in FIG. 3B). The leads 344, 346 may then pass along a radial extent of the upper arm 310 through channels formed in the arm and extend radially outward towards the elbow axis 348 where the leads 344, 346 pass through openings 345 formed through the upper arm 310 (as best shown in FIGS. 3A, 5 and 6).

Figure 5:
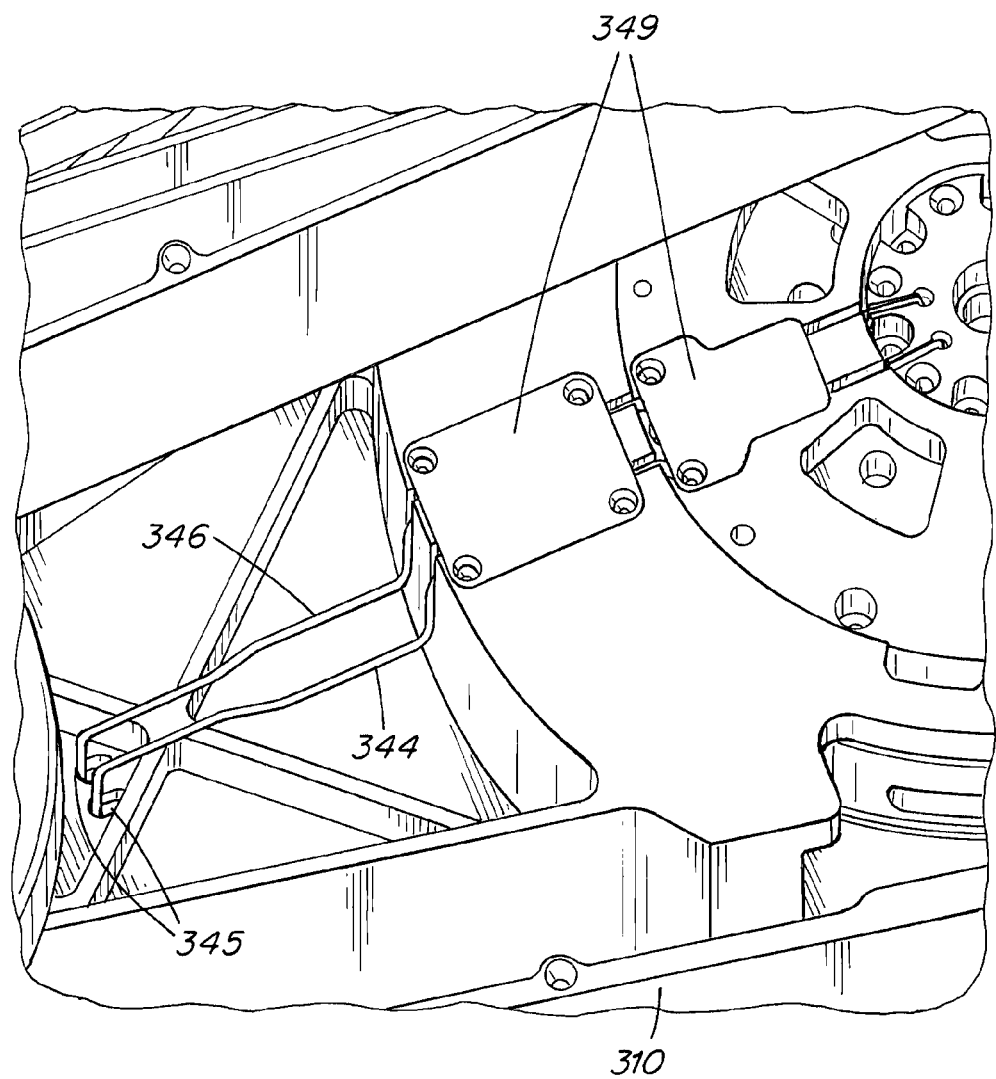
FIG. 5 is a partial perspective view of electrical leads passing along an upper arm of the robot apparatus of FIG. 3A according to embodiments of the present invention.
Figure 6:
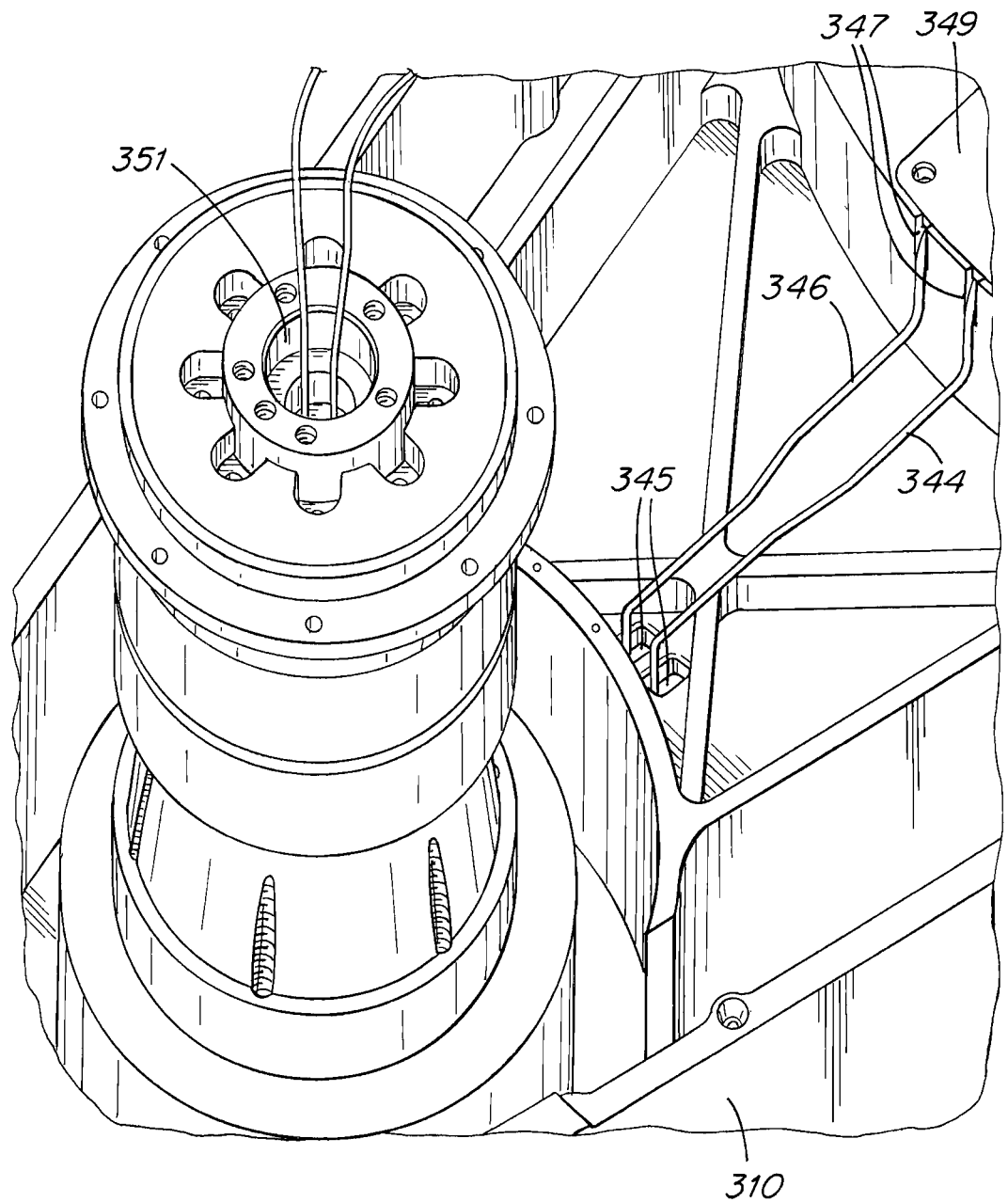
FIG. 6 is a partial perspective top view of the electrical leads passing through openings in an upper arm of the robot apparatus of FIG. 3A according to embodiments the present invention.

As shown in FIGS. 5 and 6, the channels 347 formed in the upper arm 310 receive the electrical leads 344, 346. The channels 347 are slightly less deep than the diameter of the electrical leads 344, 346 such that when a clamping member 349 is secured in place by fasteners (not shown) the electrical leads 344, 346 will be slightly compressed and securely fastened in place. Accordingly, the wires may not move radially inward or outward during operation of the upper arm 310. Creep of the wire leads without the clamping member 349 may cause breakage and/or excessive wear of the electrical leads 344, 346. A suitable relief may be provided in the area passing through the shaft to accommodate any limited windup due to rotation of the upper arm 310. The clamping member 349 may include one or more plates or other members adapted to clamp the wire leads 344, 346 in place. Any other suitable clamping mechanism to prevent radial movement of the electrical leads 344, 346 may be used. The electrical leads 344, 346 may be copper or silver plated copper and may be sheathed in a suitable insulator, such as TEFLON® or KAPTON® both available from DuPont.

Figure 7A:
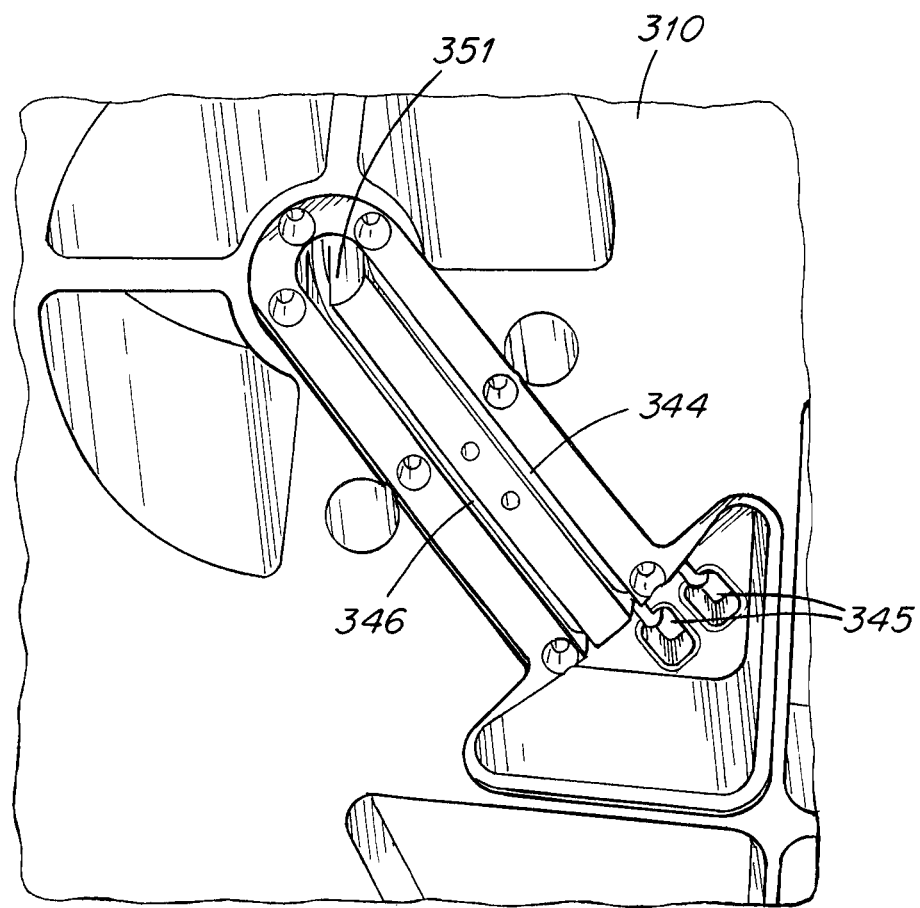
FIG. 7A is a partial perspective underside view of the electrical leads passing along the upper arm according to embodiments of the present invention.
Figure 7B:
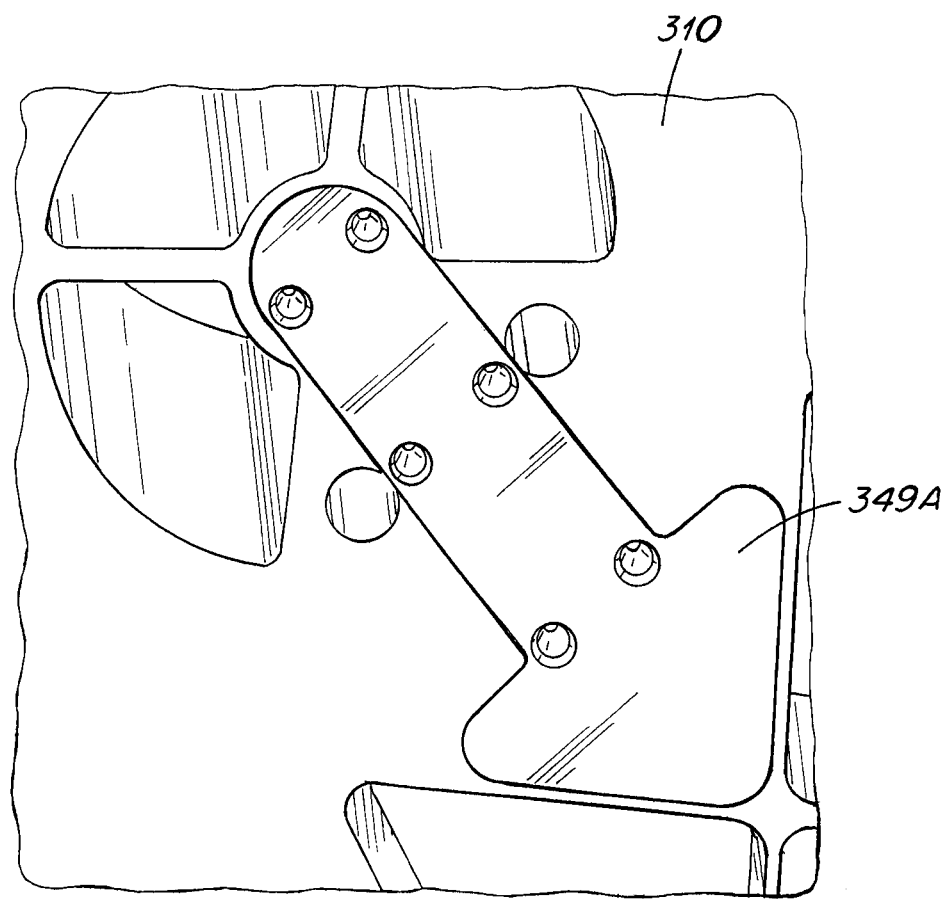
FIG. 7B is a partial perspective underside view of the electrical leads of FIG. 7A being clamped by a member according to embodiments of the present invention.
Figure 8:
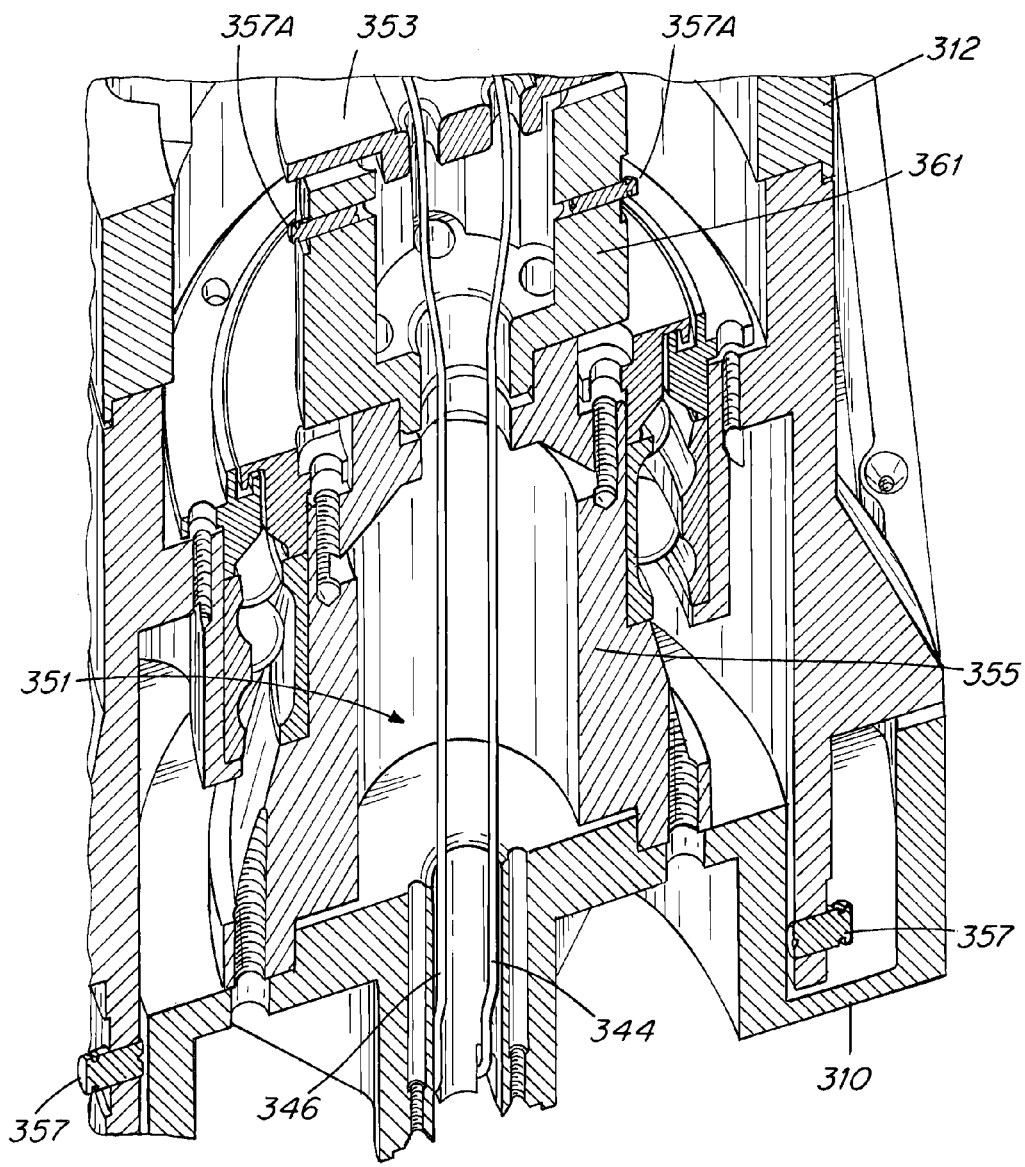
FIG. 8 is a partial cross-sectional view of an elbow joint of the robot apparatus of FIG. 3A according to embodiments of the present invention.

Now referring to FIGS. 7A-7B and FIG. 8, after passing through the openings 345 in the upper arm 310, the leads 344, 346 may pass through additional channels and then pass through joint opening 351 (see also FIG. 6). Thus, the leads 344, 346 extend between the upper arm 310 and forearm 312 as best shown in a cross-sectional side view of FIG. 8 thereby extending through the elbow joint. The leads 344, 346 pass through a hole in the upper arm 310, through a hole in a bearing support 355, and through a hole in a wrist drive pulley 361, which is secured to the bearing support 355. The wrist pulley 361 attaches to the wrist member (not shown) via a metal drive belt (also not shown) which is connected at pins 357A. As should be recognized, rotation of the forearm 312 via a metal drive belt (not shown) attached at pins 357 and interconnecting to a drive member at the shoulder axis (not shown) causes rotation of the positioning member 353, but does not cause rotation of the wrist drive pulley 361. Accordingly, any rotation or twisting of the electrical leads 344, 346 is accommodated in the opening 351. Smooth finishes and providing radiuses on any contact corner surfaces may minimize wear of the leads.

As shown in FIG. 7B, a clamping member 349A or other suitable clamping mechanism may be attached to the arm 310 by fasteners (not shown) or other suitable means and may be adapted to clamp the electrical leads 344, 346 and hold them securely in place and prevent radial movement of the leads 344, 346 relative to the arm 310.

Figure 9A:
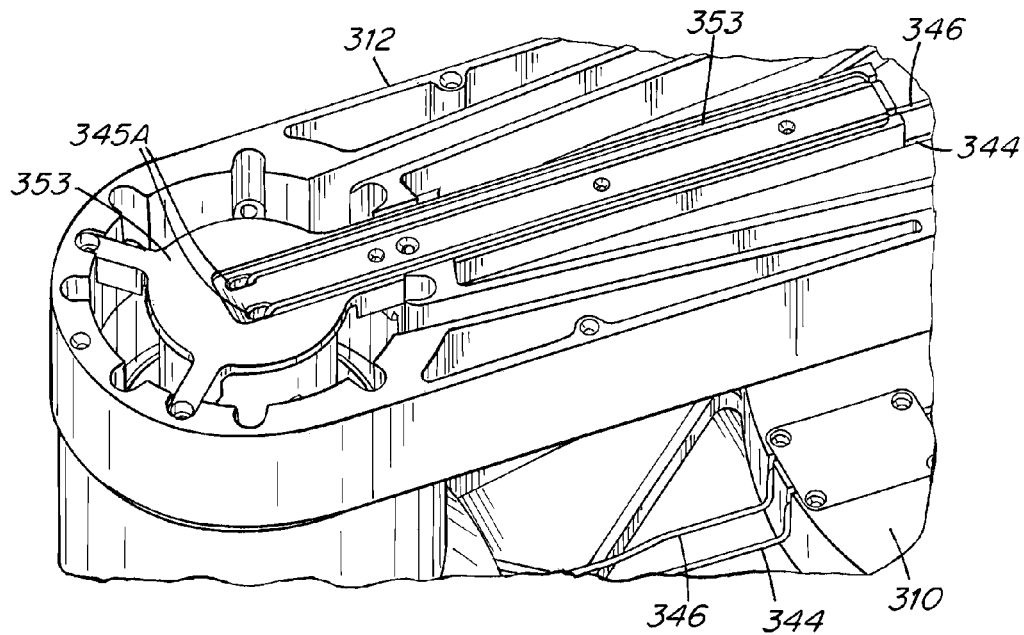
FIGS. 9A and 9B are partial perspective views of portions of the robot apparatus of FIG. 3A illustrating a positioning member according to embodiments of the present invention.
Figure 9B:
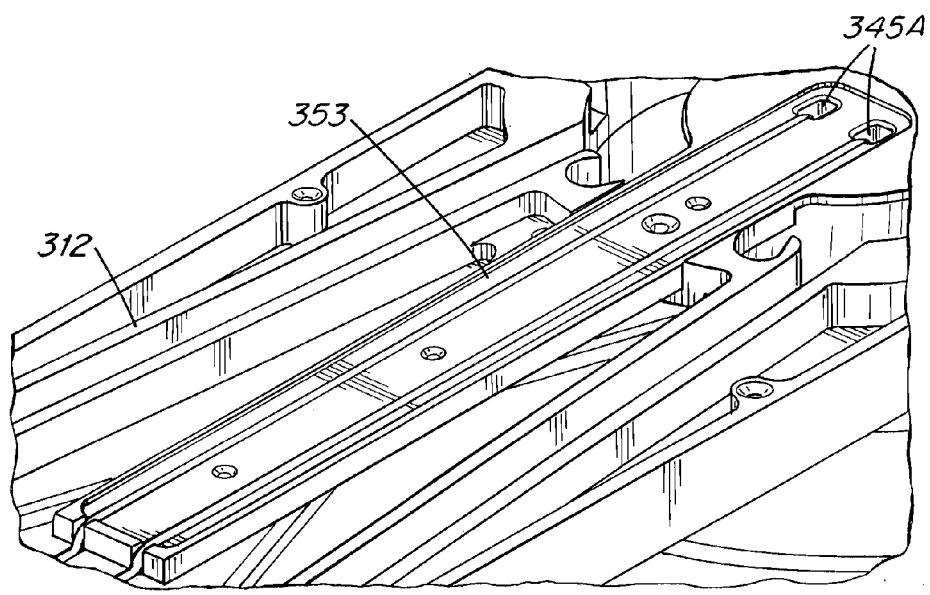

Once the electrical leads 344, 346 pass through the opening 351, the leads then extend along a radial length of the forearm 312 as best shown in FIGS. 9A, 9B. The leads 344, 346 pass along a positioning member 353, which is adapted to position the leads over an approximate center of the opening 351 (FIG. 8). The positioning member 353 may include openings 345A proximate one end of the forearm 312 where the opening is located. The openings 345A may be laterally spaced apart so as to minimize any contact between the electrical leads 344, 346 as they extend through the opening 351. As before, a suitable amount of strain relieving extra length of electrical lead may be provided as the electrical leads passes through the opening 351 to accommodate the rotation of the forearm 312 relative to the upper arm 310.

Figure 10:
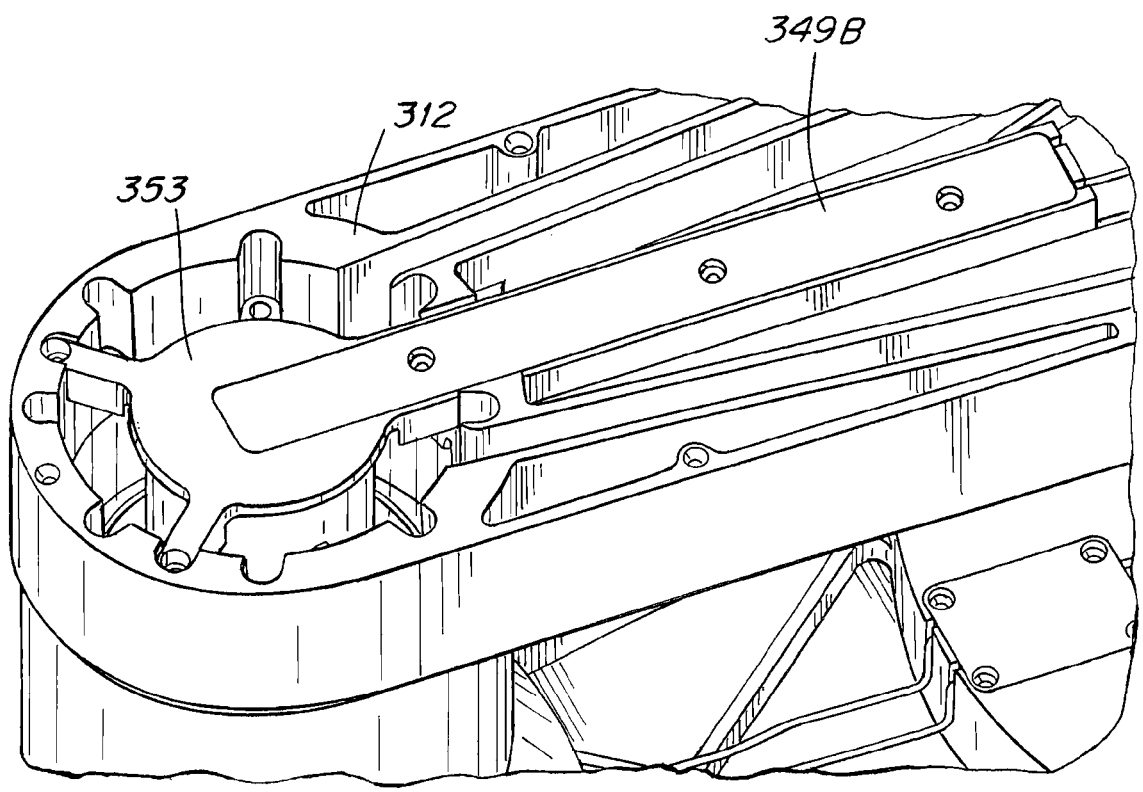
FIG. 10 is a partial perspective view of a portion of the robot apparatus of FIG. 3A illustrating a clamping member securing the electrical leads to a positioning member according to embodiments of the present invention.

The positioning member 353 may extend from the shaft towards the wrist member (not shown) provided on the other end of the forearm 312 and may connect to an upper portion of the forearm by fasteners (e.g., screws) or other suitable fastening means. The positioning member 353 may include channels formed therein for accepting the electrical leads 344, 346. As shown in FIG. 10, a clamping member 349B or other suitable clamping mechanism may be attached to the positioning member 353 by fasteners (not shown) or other suitable means and may be adapted to clamp the electrical leads 344, 346 and hold them securely in place and prevent radial movement of the electrical leads 344, 346 relative to the forearm 312.

Figure 11:
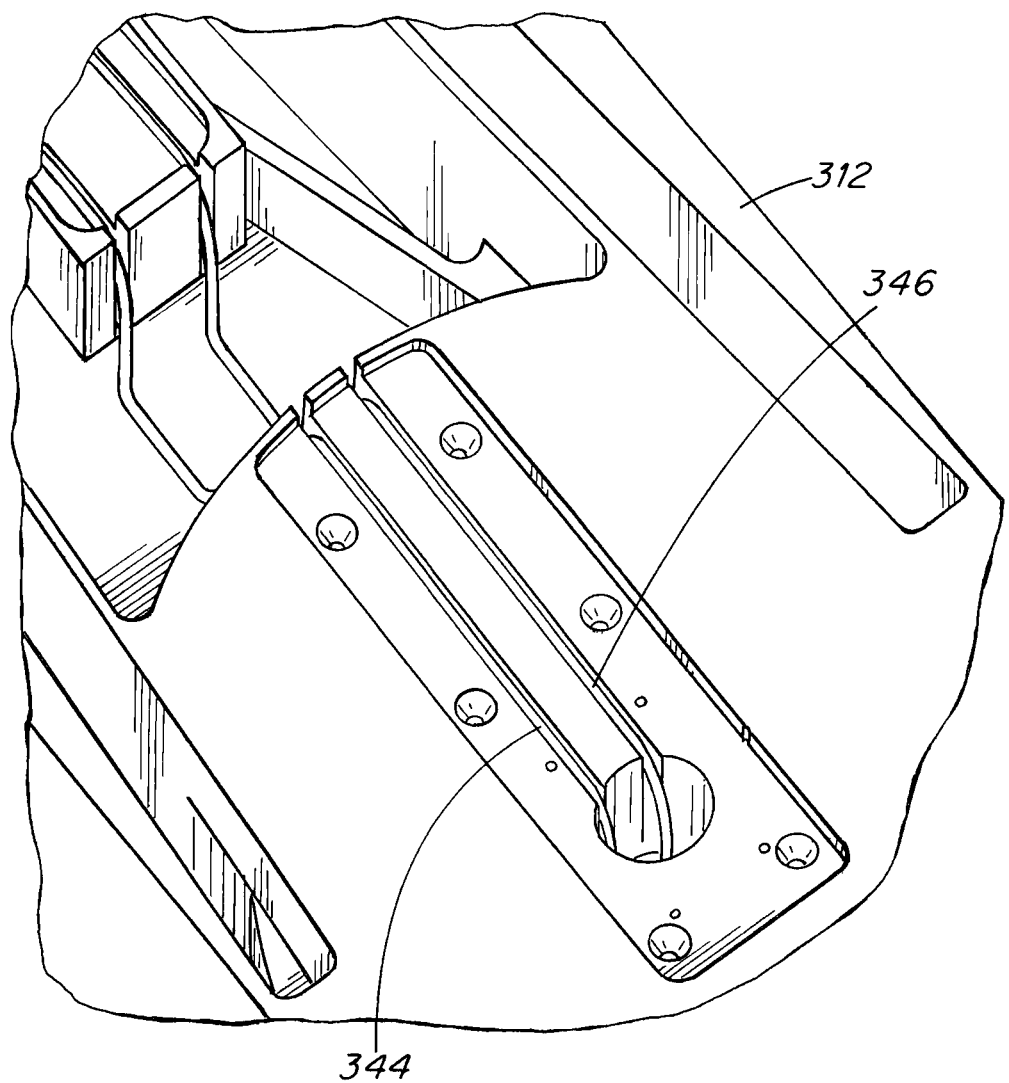
FIG. 11 is a partial perspective view of an outboard portion of the robot apparatus of FIG. 3A illustrating the electrical leads extending along a forearm according to embodiments of the present invention.
Figure 12:
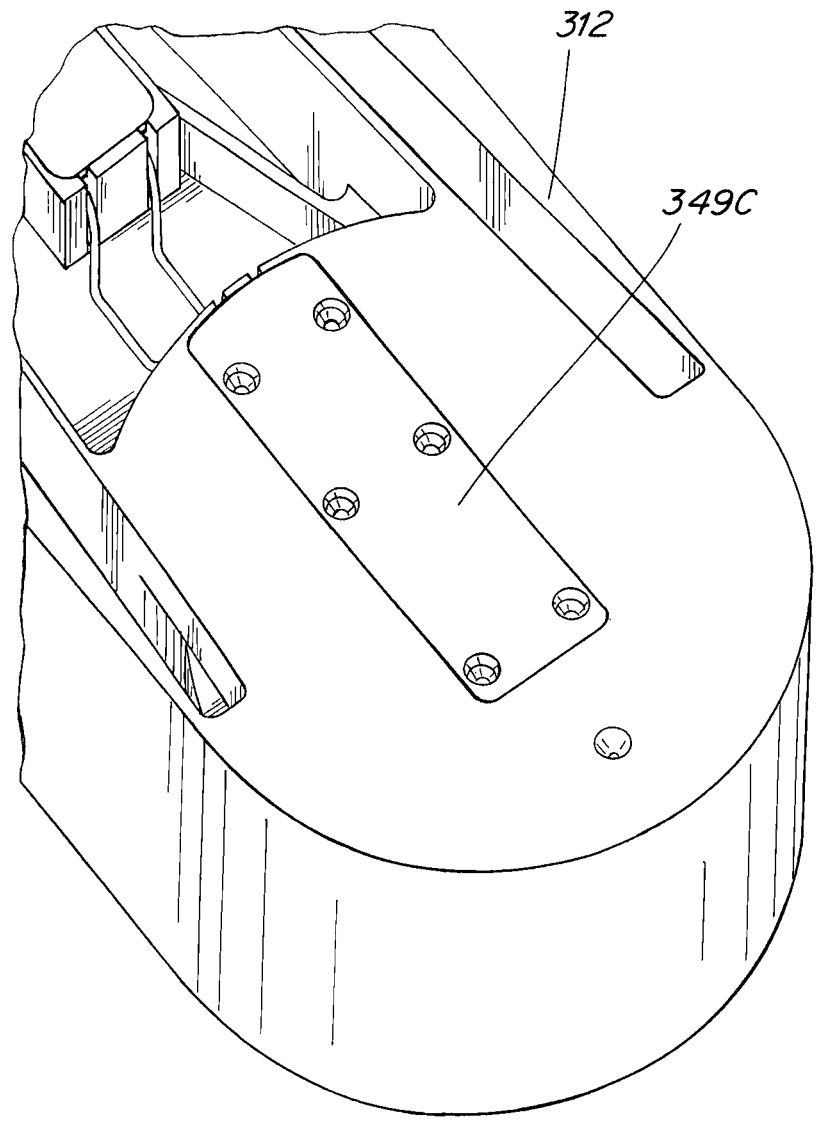
FIG. 12 is a partial perspective view of an outboard portion of the robot apparatus of FIG. 3A illustrating a clamping member securing the electrical leads to a forearm according to embodiments of the present invention.

Now referring to FIG. 11, the leads 344, 346 continue extending along the radial extent of the arm 312 and then pass through a shaft extending between the wrist member (not shown) and the forearm 312. The forearm 312 may include channels formed on its outboard end for accepting the electrical leads 344, 346. As shown in FIG. 12, a clamping member 349C or other suitable clamping mechanism may be attached to the forearm 312 at its outboard end by fasteners (not shown) or other suitable means and may be adapted to clamp the electrical leads 344, 346 and hold them securely in place and prevent radial movement of the electrical leads 344, 346 relative to the forearm 312. After passing through the passage formed through a shaft or pilot of the wrist member, the electrical leads 344, 346 connect to the electrodes of the electrical end effector 116.

Figure 13:
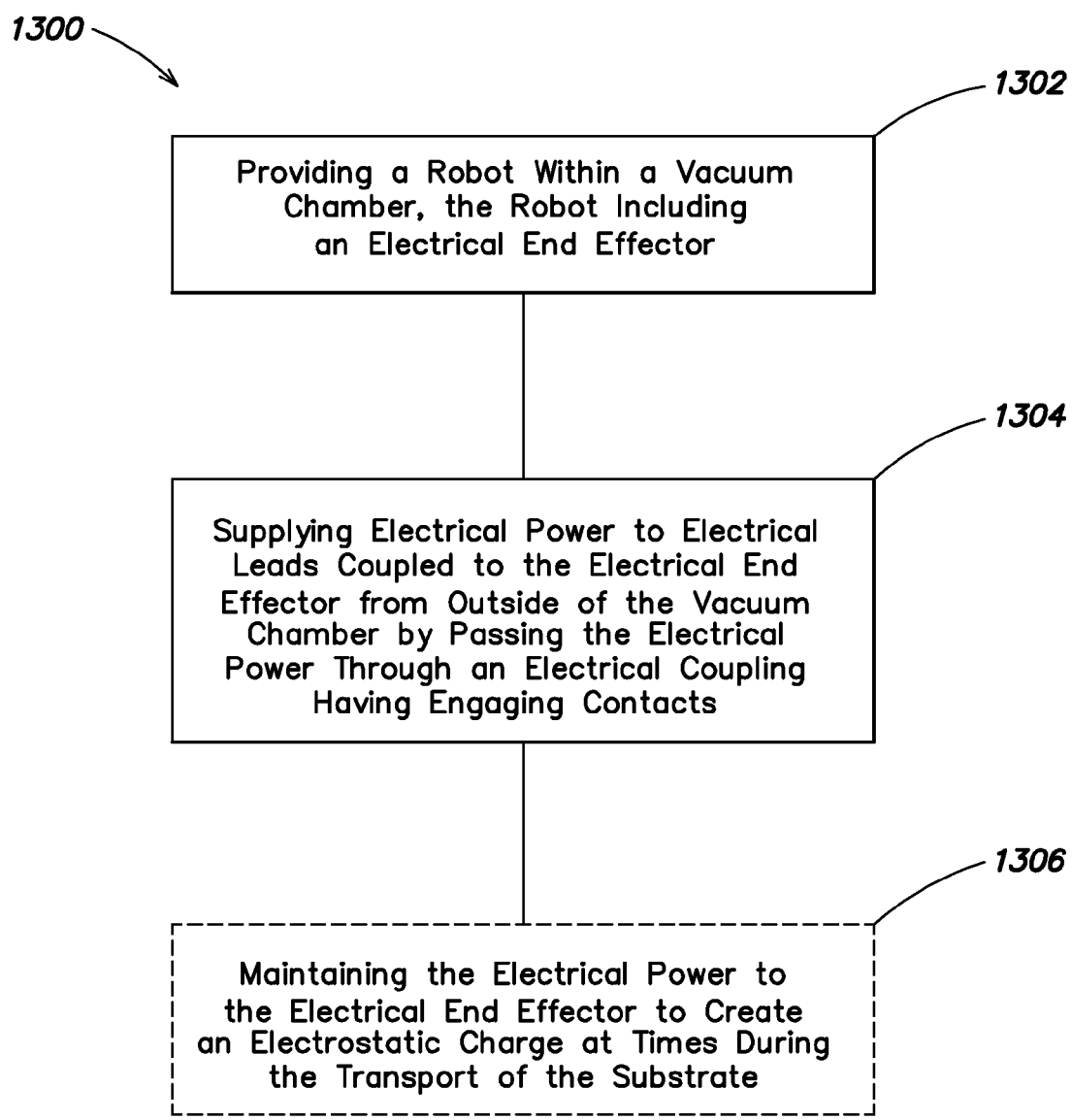
FIG. 13 is a flowchart depicting a method of operating a robot apparatus according to embodiments of the present invention.

A method 1300 according to the present invention is provided in FIG. 13. In 1302, a robot apparatus is provided within a vacuum chamber of an electronic device processing system, wherein the robot apparatus may include a plurality of robot arms and an electrical end effector attached to at least one of the robot arms. In 1304, electrical power (e.g., a current or voltage potential) may be supplied to electrical leads of an electrical circuit coupled to the electrical end effector. As such, electrical power may be supplied from outside of the vacuum, at least at certain times during the motion profile. In particular, the electrical current or voltage potential may be supplied via an electrical coupling, which may have engaging contacts, for example. In 1306, the contacts may be engaged only at certain times during the motion profile and transport of the substrate such as by an actuator (e.g., an electromagnet or solenoid); such that from time to time, the electrical engagement of the contacts may be broken. At times when the coupling is disengaged, electrical power may still be provided to the electrical end effector 116 by a chargeable component or circuit (See FIGS. 2C-2H). In other embodiments, such as the inductively coupled embodiments, the power may be provided to the end effector through inductively coupled coils (See FIGS. 14-17).

In particular, in some embodiments, the engaging contacts may move with a rotating shaft of the robot apparatus during substrate transporting events and may be disengaged during at least a short interval, such as when the robot apparatus stopped temporarily at a destination. Advantageously, during rotation of the robot apparatus, the electrical contacts may experience substantially no relative sliding motion in torsion, thus particle generation is minimized. This may be provided by allowing at least one of the electrical contacts of a contact pair to be supported on a spring, such that the spring is rotationally wound up in torsion when the contacts are engaged and when the robot arm is rotating. However, the spring is allowed to relax to a neutral position when the circuit is broken intermittently, such as when stopping the robot at a destination. When stopped, the power to the electromagnet may be cut temporarily and the spring may relax axially thus allowing the contacts to disengage. The electrical coupling allows the electrical current or voltage potential to be maintained to the electrical end effector so as to create an electrostatic charge at times during the transportation movement of the substrate, yet allows the electrical power to be cut during brief intervals to allow the contact to rotate with the spring back to a neutral torsion position and orientation.

In other embodiments, the contacts are engaged for only brief intervals during the motion profile of the robot such that a chargeable component (e.g., capacitor or array of capacitors) or a power storage and charging circuit may be charged. After charging, the electrical coupling contacts may be disengaged and electrical power may be provided to the electrical end effector 116 based upon energy stored in the power storage and charging circuit. Accordingly, in some embodiments, electrical power may be provided to the electrical end effector 116 during motion of the robot, and friction, as well as spring resistance, imparted to the robot may be minimized during the robot's motion via disengaging the contacts. Additionally, this wireless power distribution also allows for a robot to rotate freely in the same rotation direction indefinitely without twisting wires and without the need to untwist wires.

Figure 14:
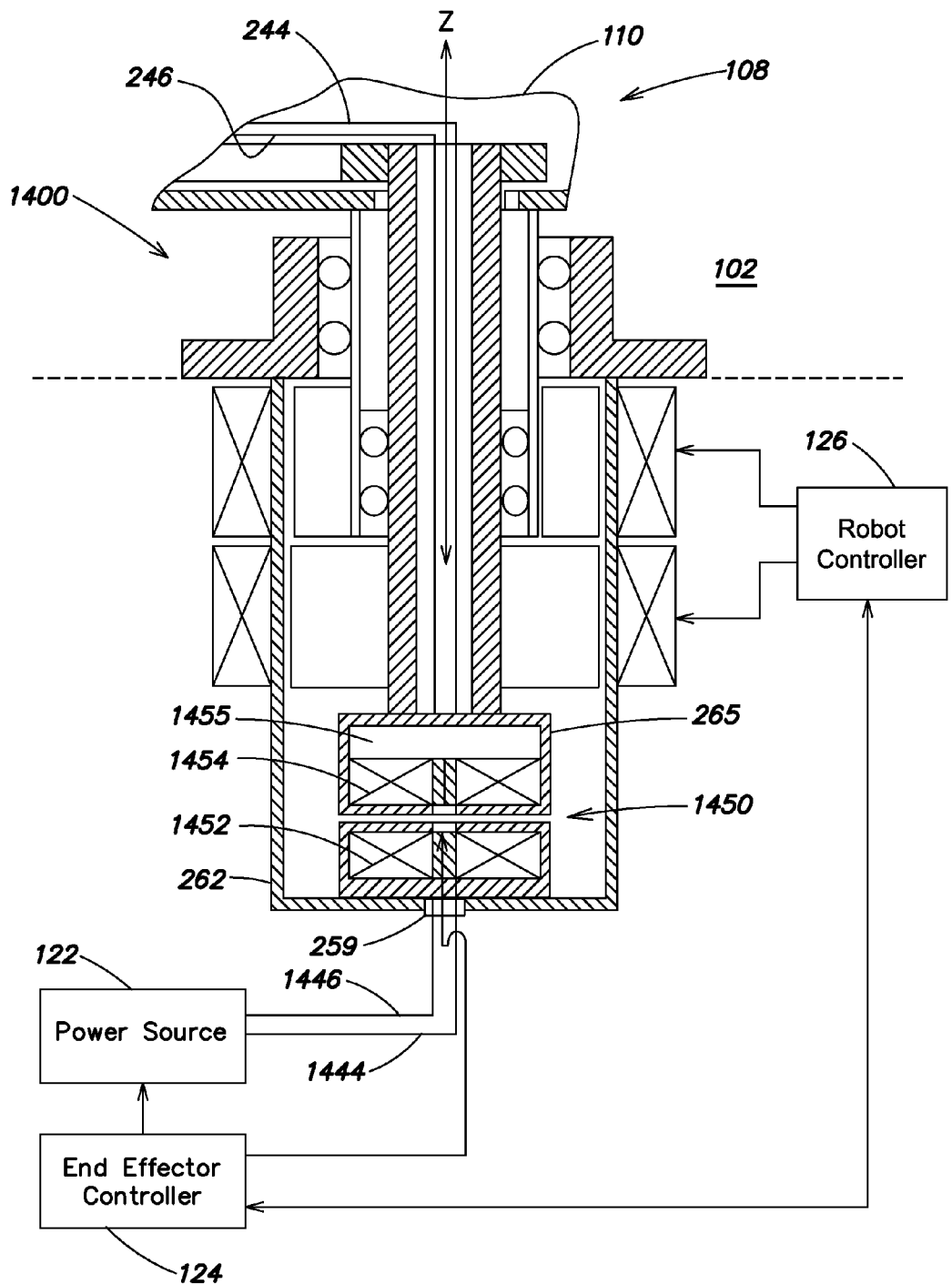
FIG. 14 is a schematic cross-sectional side view of a portion of a substrate transport system according to additional embodiments of the present invention.
Figure 15:
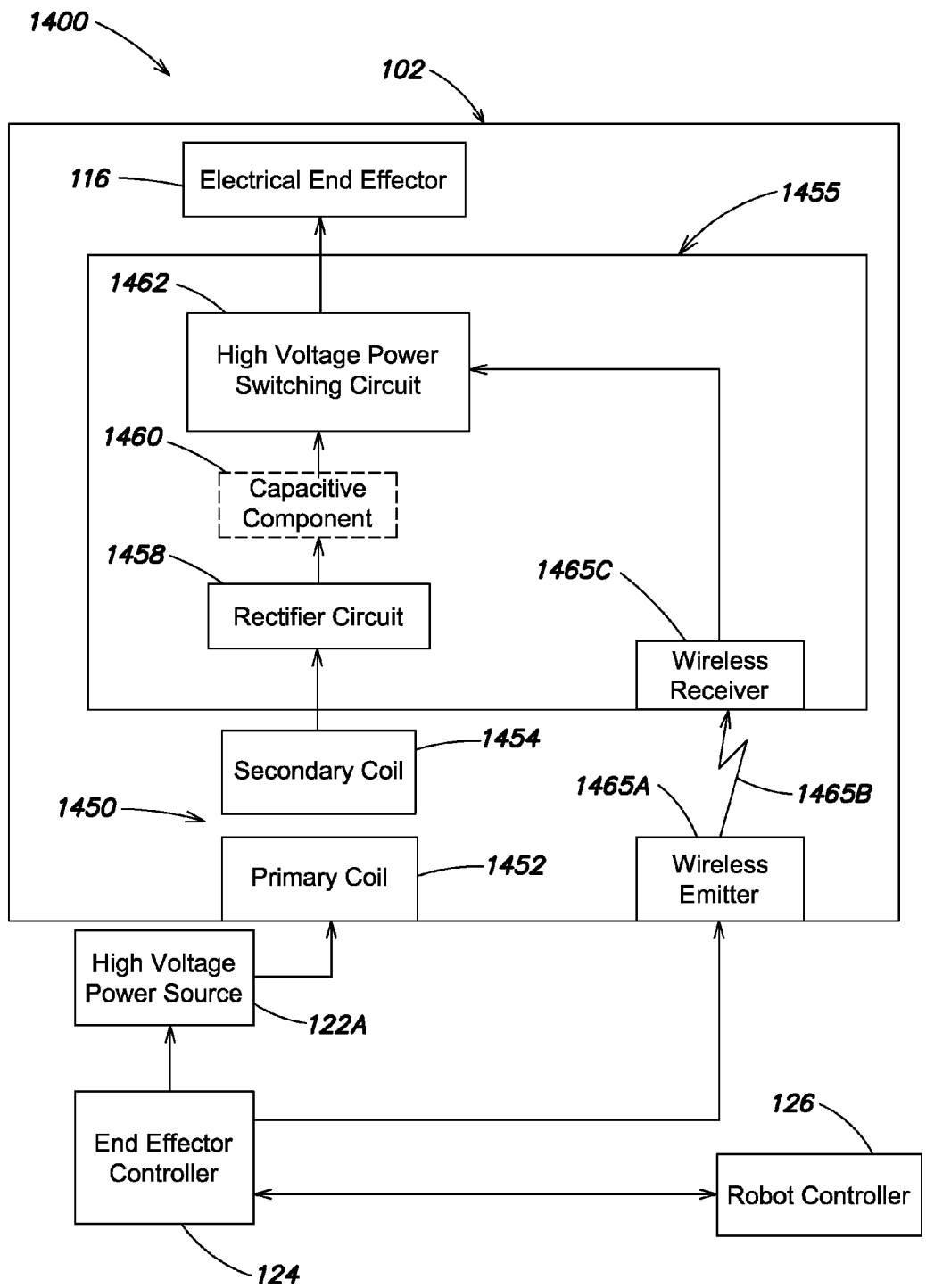
FIG. 15 is a schematic diagram of a substrate transport system according to additional embodiments of the present invention.

FIGS. 14 and 15 illustrate an alternative embodiment of a robotic system 1400, which is adapted to transport a substrate on an electrical end effector 116 (FIG. 1), which is attached to at least one arm, and preferably one of a plurality of arms (e.g., the wrist member 114) of a robot 108. The robotic system 1400 includes an electrical coupling 1450 adapted to provide electrical power to the electrical end effector 116, which may be operable within a vacuum chamber (e.g., 102). In this embodiment, the electrical coupling 1450 includes a primary coil 1452 and a secondary coil 1454, which are mounted in close proximity to one another and are inductively coupled upon energizing the primary coil 1452. The primary coil 1452 may be stationarily mounted relative to the motor housing 262, whereas the secondary coil 1454 may be mounted for rotation along with the shaft 265.

The primary coil 1452 may be driven by a high voltage pulsed power source 122 to cause a pulsed current flow, such as a square wave current pulse, in the primary coil 1552. The pulsed power source 122 may be any suitable voltage source, such as an interlocked voltage source of about 500 V to 2,000 V, for example. Other voltage magnitudes may be used.

In operation, the current flow in the primary coil 1452 induces a current flow in the secondary coil 1454. The flow of current may be effectively switched on and off by the end effector controller 124, which may turn on an off the power source 122 and suitable means for providing signal oscillation, for example, at desired times within the robot's motion profile. However, it should be apparent that because the electrical coupling 1450 doesn't require electrical contacts, as in the previous embodiment, that charging may occur at any time during the robot's motion profile, for example. Of course, it is possible that the inductively coupled coils could directly power the end effector continuously or even without use of capacitors.

In order to store and control the electrical energy transmitted to secondary coil 1454, the coil 1454 may be coupled to a power storage and distribution circuit 1455, which in turn provides regulated flow of current and/or voltage potential to the electrical end effector 116 through electrical leads 244, 246 which may pass through the respective arms 110, 112, 114 of the robot 108 (only a portion of which is shown for clarity).

In more detail, the power storage and distribution circuit 1455 may include a rectifier circuit 1458, such as a bridge rectifier, which functions to provide full or partial-rectification of the alternating current induced in the secondary coil 1454 and converts the current into a direct current. It is possible to implement the invention without the rectification circuit. For example, using alternating current, an averaging affect can be achieved. Additionally, offset phases of alternating currents can be used to provide an average voltage to the end effector 116, suitable for the desired electrostatic force. The direct current mentioned above may charge an optional capacitive component 1460. The capacitive component 1460 may be a single capacitor or an array of capacitors arranged in electrical series or parallel with one another, for example. For some embodiments, a capacitor or array of capacitors providing a capacitance of about 1600 µF may be employed and may provide suitable chucking power for the electrostatic end effector 116. Other sized capacitances may be used. Electrical power stored in the capacitive component 1460 may be provided to the electrical end effector 116 at appropriate times by a high voltage power switching circuit 1462.

The high voltage power switching circuit 1462 may function to connect and disconnect power to the electrodes of the electrical end effector 116 at certain times during the motion profile of the robot 108. Further, the switching circuit 1462 may function to short the electrodes when de-chucking the substrate from the end effector 116, such as when conducting a put operation. This shorting of the electrodes causes a rapid dissipation of any electrostatic potential, resulting in rapid release of the substrate. In some embodiments, a state of the current and/or voltage potential provided to the electrical end effector 116 may be monitored, as was described above, and which is further described with reference to FIG. 16.

In the present embodiment, an electrical signal designating an on/off (chuck/dechuck condition) may be provided to the high voltage power switching circuit 1462. In particular, a control signal may be output from the end effector controller 124 to an emitter 1565A, such as the wireless emitter (e.g., a photo emitter (LED)). The wireless signal 1565B (e.g., light signal) may be received at a wireless receiver 1565C (e.g., a photo sensor) arranged and positioned to receive the transmitted signal (e.g., light signal). The signal received by the wireless receiver 1465C may be sent to the switching circuit 1462 to cut power to, and/or short the electrodes of the electrical end effector 116. Any suitable wireless communication may be used, such as diodes and photo sensors.

Figure 16:
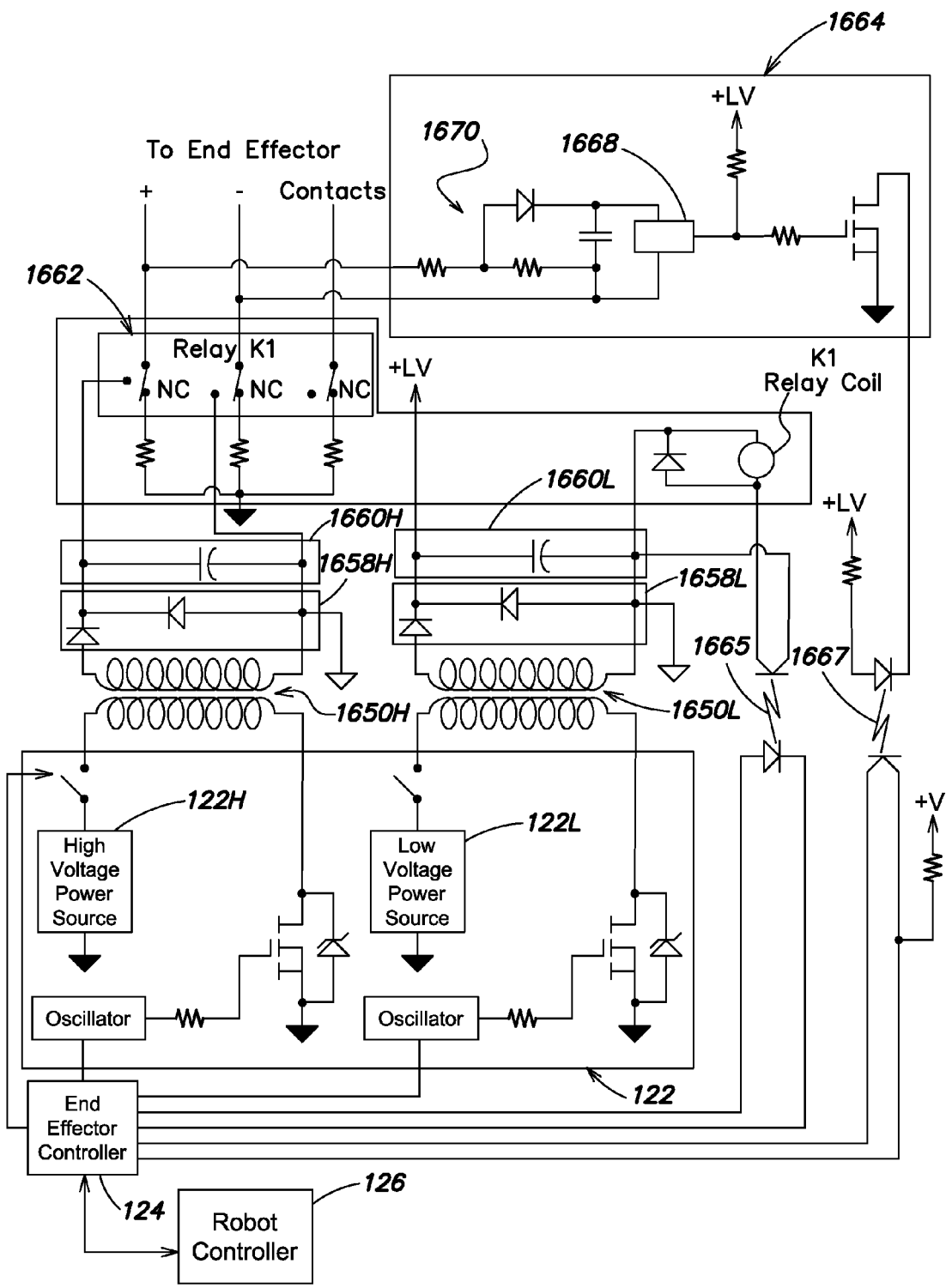
FIG. 16 is a schematic circuit diagram of a substrate transport system according to additional embodiments of the present invention.
Figure 17:
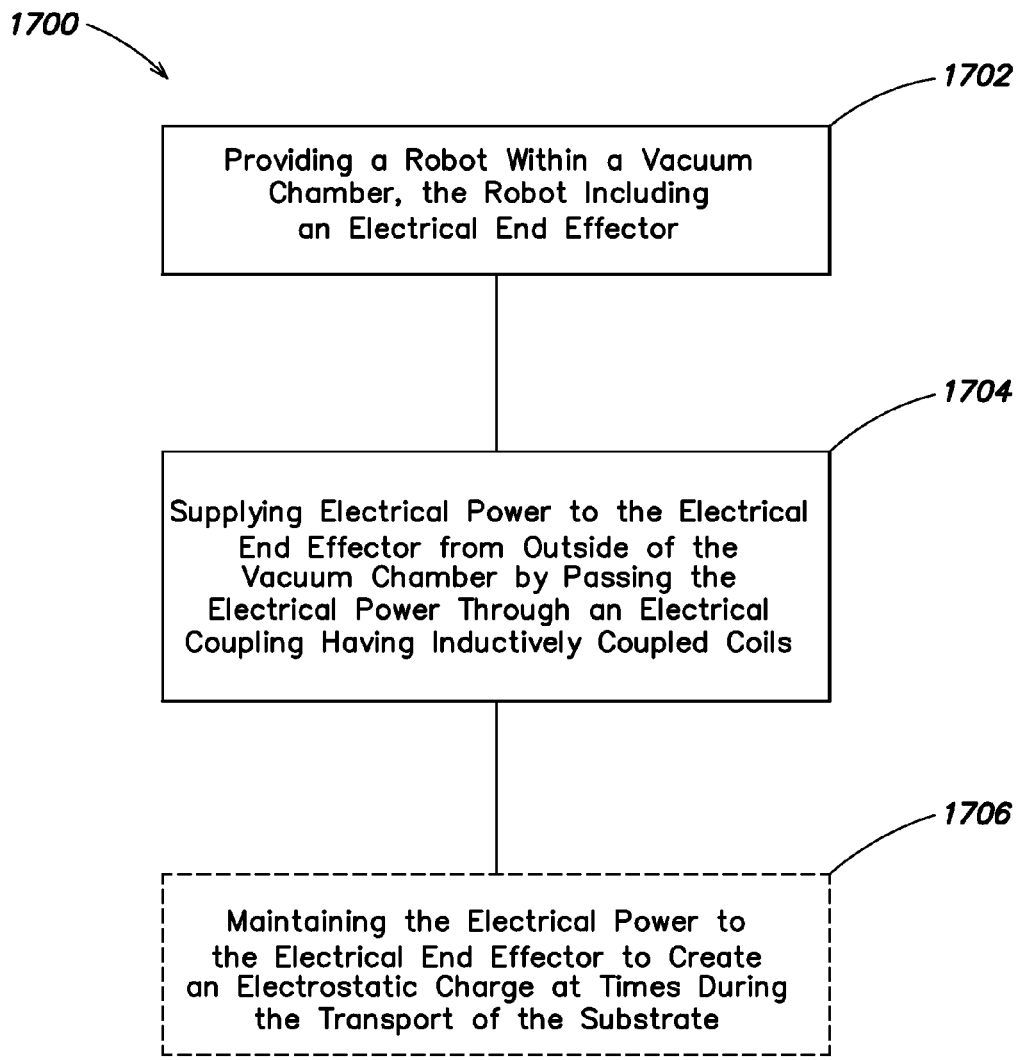
FIG. 17 is a flowchart depicting a method of operating a robot apparatus according to embodiments of the present invention.

In further embodiments, such as in the embodiment shown in FIG. 16, the communication may be a two-way, where wireless signals 1665, 1667 may be provided from emitters to receivers to control the switching circuit so as to short the electrodes and/or to cut power to the end effector 116 (in the case where a capacitive component 1660 is included). Another example of two way communication is for one signal to provide a chuck or de-chuck signal, which actuates or de-actuates respectively, the high voltage relay in the power storage and distribution circuit 1662. The other wireless signal may be used to monitor the voltage level on the secondary coil side and send a corresponding signal back to the end effector controller 124. Additionally, second low voltage coils 1650L may be used to provide a low voltage source to power the various electrical components. The low voltage coils 1650L may be nested (co-axial) inside of our outside of the high voltage coils 1650H.

FIG. 16 illustrates an electrical circuit diagram, which may be used to accomplish the functions described above. As shown, a power source 122 is provided, which couples high and low voltage sources 122H, 122L to the respective high and low voltage primary and secondary coils of the electrical couplings 1650L, 1650H. Power is transferred between the coils by inductive coupling. Rectifier circuits 1658L, 1658H may rectify the AC current supplied to DC. The direct current may then be stored as electrical energy in capacitive components 1660L, 1660H. Capacitive components 1660L, 1660H may be a suitably-sized capacitor or array of capacitors. Switching circuit 1662 controls the power (voltage potential) provided to the positive (+) and negative (−) electrodes of the end effector 116, by switching relay K1 from a grounded condition on normally-closed switches to a powered condition. The grounded condition (normally closed) allows the electrical end effector electrodes to be shorted together or at least resistively connected to each other such that they voltage potential between the electrodes is effectively neutralized to a level in which the substrate is no longer held in place on the end effector 116. The powered condition actuates the relay contacts causing the end effector electrodes to become electrically isolated from each other and at the same time, each individual electrode is connected to the high voltage power source stored, in this example, stored in capacitor 1660H.

A feedback circuit 1664 may provide feedback information concerning the voltage level supplied to electrodes of the electrical end effector 116. An optical diode coupled to the feedback circuit 1664 may be normally powered. A voltage supervisor 1668 (e.g., STM 1061) may sink its output voltage when the high voltage to the end effector 116, as monitored by the circuit 1664, falls below a predetermined threshold set by a voltage divider 1670. The sinking output of the voltage regulator turns off the N-channel mosfet shown in 1664, thus disabling or at least partially disabling current flow through the LED emitter 1667. This extinguishes the LED 1667. The lack of signal 1667 may then be communicated via a signal from a wireless photo sensor receiver to the controller 124. For example, a pull-up resistor coupled between the anode of 1667 and V+ will cause the signal to the end effector controller 124 to be pulled up to V+ level when LED 1667 is extinguished. Accordingly, as a result of the low voltage feedback, additional charging may be provided as needed, or other remedial measures may be communicated to the robot controller 126 causing the robot 108 to stop or slow down to prevent the substrate from falling from the end effector 116.

The foregoing description discloses only exemplary embodiments of the invention. Modifications of the above-disclosed systems, apparatus and methods which fall within the scope of the invention will be readily apparent to those of ordinary skill in the art.

Accordingly, while the present invention has been disclosed in connection with exemplary embodiments thereof, it should be understood that other embodiments may fall within the spirit and scope of the invention, as defined by the following claims.

The invention claimed is:

1. A robotic system, comprising:
    a vacuum chamber;
    a robot apparatus adapted to transport substrates within the vacuum chamber, the robot apparatus including:
        an electrical coupling comprising selectively engaging contacts, the electrical coupling adapted to provide electrical energy to the robot apparatus in the vacuum chamber.

2. The system of claim 1 wherein the electrical coupling comprises an electromagnet operative to move a first set of the selectively engaging contacts into contact with a second set of the selectively engaging contacts.

3. The system of claim 1 wherein the electrical coupling comprises inductively coupleable coils.

4. The system of claim 1 wherein an electrical circuit passes through one or more rotation joints of one or more arms of the robot apparatus adapted to be rotated within the vacuum chamber.

5. The system of claim 1 wherein the electrical coupling comprises a moveable member suspended by a spring member.

6. The system of claim 5 wherein the moveable member includes electrical contacts.

7. The system of claim 6 wherein the electrical coupling includes an electromagnet adapted to cause movement of the moveable member and an engagement of the electrical contacts with electrical contacts coupled to a shaft of the robot apparatus.

8. The system of claim 1 wherein the electrical coupling comprises an engaging recess and pilot adapted to align engaging electrical contacts.

9. The system of claim 1 wherein the electrical coupling is electrically coupled to a capacitor member.

10. A substrate transporting robot apparatus adapted to move substrates within an electronic device processing system, comprising:
    a robot; and
    an electrical coupling comprising selectively engaging electrical contacts, the electrical coupling adapted to provide electrical energy from a power source to the robot.

11. The apparatus of claim 10 wherein the selectively engaging electrical contacts comprise opposing pairs of annular rings.

12. The apparatus of claim 10 wherein the electrical coupling comprises inductively coupleable coils.

13. The apparatus of claim 10 wherein the electrical coupling comprises a moveable member suspended by a spring member.

14. The apparatus of claim 10 wherein the spring member is adapted to allow rotation of the moveable member in torsion such that the moveable member rotates with a shaft coupled to the robot apparatus when the electrical coupling is in an engaged condition.

15. The apparatus of claim 10 wherein the electrical coupling comprises an electromagnet adapted to move a first set of electrical contacts of the selectively engaging electrical contacts into contact with a second set of electrical contacts of the selectively engaging electrical contacts.

16. A method of moving a substrate within an electronic device processing tool, comprising the steps of:
    providing a robot within a vacuum chamber; and
    supplying electrical energy to electrical leads coupled to the robot by passing the electrical current through selectively engageable contacts.

17. A substrate transporting robot apparatus adapted to move substrates within an electronic device processing system, comprising:
    a robot;
    an electrical coupling comprising selectively engaging electrical contacts; and electrical leads which pass through the robot, wherein electrical energy is supplied to the electrical leads by passing an electrical current through the selectively engaging electrical contacts.

18. The substrate transporting robot apparatus of claim 17 wherein the electrical leads are clamped at locations proximate one or more rotational joints of one or more moveable arms of the robot.

19. The substrate transporting robot apparatus of claim 18 wherein the electrical leads are clamped in channels by a clamping member.

20. The substrate transporting robot apparatus of claim 17 further comprising a positioning member adapted to approximately align the electrical leads with a center of one or more rotational joints of one or more moveable arms of the robot.

* * * * *